United States Patent
Uesugi et al.

(10) Patent No.: US 7,876,537 B2
(45) Date of Patent: Jan. 25, 2011

(54) MAGNETORESISTIVE ELEMENT INCORPORATING CONDUCTIVE FILM DISPOSED ON PERIPHERAL SURFACE OF LAYERED STRUCTURE INCLUDING SPACER LAYER, FREE LAYER AND PINNED LAYER, THE CONDUCTIVE FILM ALLOWING CONDUCTION BETWEEN THE FREE LAYER AND THE PINNED LAYER

(75) Inventors: Takumi Uesugi, Tokyo (JP); Tetsuro Sasaki, Tokyo (JP); Takeo Kagami, Tokyo (JP); Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 944 days.

(21) Appl. No.: 11/790,396

(22) Filed: Apr. 25, 2007

(65) Prior Publication Data

US 2008/0024934 A1     Jan. 31, 2008

(30) Foreign Application Priority Data

Jul. 31, 2006    (JP)    ............................ 2006-207808

(51) Int. Cl.
*G11B 5/39*        (2006.01)
(52) U.S. Cl. ............................................. 360/324.12
(58) Field of Classification Search ....................... None
See application file for complete search history.

(56) References Cited

U.S. PATENT DOCUMENTS

| | | | |
|---|---|---|---|
| 6,061,210 A * | 5/2000 | Gill | 360/324.12 |
| 6,292,335 B1 * | 9/2001 | Gill | 360/324.11 |
| 7,002,781 B2 | 2/2006 | Sugawara | |
| 2004/0042127 A1 * | 3/2004 | Hoshiya et al. | 360/322 |
| 2004/0114284 A1 * | 6/2004 | Rachid et al. | 360/324.11 |
| 2005/0002126 A1 | 1/2005 | Fujiwara et al. | |
| 2005/0068688 A1 | 3/2005 | Sbiaa et al. | |

FOREIGN PATENT DOCUMENTS

| | | |
|---|---|---|
| JP | A 2004-103769 | 4/2004 |
| JP | A 2005-026699 | 1/2005 |
| JP | A 2005-109241 | 4/2005 |

* cited by examiner

*Primary Examiner*—Mark Blouin
(74) *Attorney, Agent, or Firm*—Oliff & Berridge, PLC

(57) ABSTRACT

An MR element incorporates a layered structure. The layered structure includes: a spacer layer having a first surface and a second surface that face toward opposite directions; a free layer disposed adjacent to the first surface of the spacer layer and having a direction of magnetization that changes in response to a signal magnetic field; and a pinned layer disposed adjacent to the second surface of the spacer layer and having a fixed direction of magnetization. The spacer layer is a layer at least part of which is made of a material other than a conductor, and the spacer layer intercepts the passage of currents or limits the passage of currents as compared with a layer entirely made of a conductor. The MR element further incorporates a conductive film that is disposed on the peripheral surface of the layered structure and allows conduction between the free layer and the pinned layer.

19 Claims, 19 Drawing Sheets

MAGNETORESISTIVE ELEMENT INCORPORATING CONDUCTIVE FILM DISPOSED ON PERIPHERAL SURFACE OF LAYERED STRUCTURE INCLUDING SPACER LAYER, FREE LAYER AND PINNED LAYER, THE CONDUCTIVE FILM ALLOWING CONDUCTION BETWEEN THE FREE LAYER AND THE PINNED LAYER

BACKGROUND OF THE INVENTION

1. Field of the Invention

The present invention relates to a magnetoresistive element and to a thin-film magnetic head, a head gimbal assembly, a head arm assembly, a magnetic disk drive, a magnetic sensor and a magnetic memory each of which incorporates the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write (recording) head having an induction-type electromagnetic transducer for writing and a read (reproducing) head having a magnetoresistive (MR) element for reading are stacked on a substrate.

MR elements include giant magnetoresistive (GMR) elements utilizing a giant magnetoresistive effect, and tunneling magnetoresistive (TMR) elements utilizing a tunnel magnetoresistive effect.

It is required that the characteristics of a read head include high sensitivity and high output capability. GMR heads incorporating spin-valve GMR elements have been mass-produced as read heads that satisfy such requirements. Recently, developments in read heads using TMR elements have been sought to conform to further improvements in areal recording density.

Typically, a spin-valve GMR element incorporates: a nonmagnetic conductive layer having two surfaces facing toward opposite directions; a free layer disposed adjacent to one of the surfaces of the nonmagnetic conductive layer; a pinned layer disposed adjacent to the other of the surfaces of the nonmagnetic conductive layer; and an antiferromagnetic layer disposed adjacent to one of the surfaces of the pinned layer farther from the nonmagnetic conductive layer. The free layer is a ferromagnetic layer in which the direction of magnetization changes in response to a signal magnetic field. The pinned layer is a ferromagnetic layer in which the direction of magnetization is fixed. The antiferromagnetic layer is a layer that fixes the direction of magnetization in the pinned layer by means of exchange coupling with the pinned layer.

Conventional GMR heads have a structure in which a current used for detecting magnetic signals (that is hereinafter called a sense current) is fed in the direction parallel to the plane of each layer making up the GMR element. Such a structure is called a current-in-plane (CIP) structure. On the other hand, developments have been made for another type of GMR heads having a structure in which the sense current is fed in a direction intersecting the plane of each layer making up the GMR element, such as the direction perpendicular to the plane of each layer making up the GMR element. Such a structure is called a current-perpendicular-to-plane (CPP) structure. A GMR element used for read heads having the CPP structure is hereinafter called a CPP-GMR element. A GMR element used for read heads having the CIP structure is hereinafter called a CIP-GMR element.

A read head incorporating the TMR element mentioned previously has the CPP structure, too. Typically, the TMR element incorporates: a tunnel barrier layer having two surfaces facing toward opposite directions; a free layer disposed adjacent to one of the surfaces of the tunnel barrier layer; a pinned layer disposed adjacent to the other of the surfaces of the tunnel barrier layer; and an antiferromagnetic layer disposed adjacent to one of the surfaces of the pinned layer farther from the tunnel barrier layer. The tunnel barrier layer is a nonmagnetic insulating layer that allows electrons to pass therethrough while the electrons maintain spins by means of the tunnel effect. The free layer, the pinned layer and the antiferromagnetic layer are the same as those of the spin-valve GMR element.

It has been reported recently that a nanocontact that connects two ferromagnetic materials to each other exhibits a great magnetoresistive effect. It is assumed that this magnetoresistive effect is produced by a quantum effect. An MR element utilizing the magnetoresistive effect will be hereinafter called a quantum MR element.

JP 2005-109241A discloses an MR element having such a structure that two ferromagnetic layers and a nanojunction (a nanocontact) therebetween are located in one plane. In addition, as a method of forming the MR element, this publication discloses a process of forming a patterned resist film on a layer made of a ferromagnetic material, and patterning the layer made of the ferromagnetic material by ion milling.

As disclosed in JP 2005-026699A or JP 2004-103769A, for example, a CPP-GMR element including a current-confined layer has been recently proposed as an MR element capable of obtaining high output signals. Typically, a current-confined layer has a plurality of minute conductive portions that penetrate in the direction of thickness, and insulating portions that separate the conductive portions from one another. In the CPP-GMR element disclosed in JP 2005-026699A, the current-confined layer includes a mosaic structure of the conductive portions and the insulating portions. In the CPP-GMR element disclosed in JP 2004-103769A, the current-confined layer is formed of a granular film including a conductive magnetic material and a dielectric material. In this granular film, the conductive magnetic material corresponds to the conductive portions, and the dielectric material corresponds to the insulating portions.

It is assumed that, in a quantum MR element, it is required to reduce the width of a narrowest portion of a cross section of a nanocontact for achieving a great magnetoresistive effect. In the MR element having a structure as disclosed in JP 2005-109241A, the nanocontact is formed by photolithography, for example. In this case, the width of the narrowest portion of a cross section of the nanocontact is defined by photolithography. Consequently, the MR element having such a structure has a problem that it is difficult to reduce the width of the narrowest portion of the cross section of the nanocontact because of the limitation imposed by the accuracy of photolithography.

In the CPP-GMR element including the current-confined layer as disclosed in JP 2005-026699A or JP 2004-103769A, the magnetoresistive effect depends on the size and the number of the conductive portions of the current-confined layer. However, it is difficult to precisely control the size and the number of the conductive portions of the current-confined layer. The CPP-GMR element therefore has a problem that it is difficult to manufacture elements having a desired magnetoresistive effect with reliability.

OBJECTS AND SUMMARY OF THE INVENTION

It is a first object of the invention to provide a magnetoresistive element in which there is conduction between a free layer and a pinned layer through a conducting portion having a minute width, the magnetoresistive element facilitating control of the minute width of the conducting portion, and a method of manufacturing the magnetoresistive element, and to a thin-film magnetic head, a head gimbal assembly, a head arm assembly, a magnetic disk drive, and a magnetic sensor each of which incorporates the magnetoresistive element.

It is a second object of the invention to provide a magnetoresistive element in which there is conduction between two ferromagnetic layers through a conducting portion having a minute width, the magnetoresistive element facilitating control of the minute width of the conducting portion, and a method of manufacturing the magnetoresistive element, and to a magnetic memory incorporating the magnetoresistive element.

A first magnetoresistive element of the invention incorporates a layered structure including: a spacer layer having a first surface and a second surface that face toward opposite directions; a free layer disposed adjacent to the first surface of the spacer layer and having a direction of magnetization that changes in response to an external magnetic field; and a pinned layer disposed adjacent to the second surface of the spacer layer and having a fixed direction of magnetization. The spacer layer is a layer at least part of which is made of a material other than a conductor, and the spacer layer intercepts the passage of currents or limits the passage of currents as compared with a layer entirely made of a conductor. The layered structure has a peripheral surface formed of peripheral surfaces of the foregoing layers. The magnetoresistive element further incorporates a conductive film that is disposed on the peripheral surface of the layered structure and allows conduction between the free layer and the pinned layer. In the first magnetoresistive element of the invention, a current is fed between the free layer and the pinned layer such that at least part of the current passes through the conductive film.

In the first magnetoresistive element of the invention, the conductive film may be made of a magnetic material. In this case, the conductive film preferably has a thickness smaller than or equal to 2 nm.

In the first magnetoresistive element of the invention, the conductive film may be made of a nonmagnetic material. In this case, the conductive film preferably has a thickness smaller than or equal to 20 nm.

A method of manufacturing the first magnetoresistive element of the invention includes the steps of: forming the layered structure; and forming the conductive film on the peripheral surface of the layered structure.

A thin-film magnetic head of the invention incorporates: a medium facing surface that faces toward a recording medium; the first magnetoresistive element of the invention disposed near the medium facing surface for detecting a signal magnetic field sent from the recording medium as an external magnetic field; and a pair of electrodes for feeding a current for detecting the external magnetic field, the current being fed between the free layer and the pinned layer.

In the thin-film magnetic head of the invention, the peripheral surface of the layered structure may have a portion facing toward the medium facing surface, and the conductive film may be disposed between the portion of the peripheral surface and the medium facing surface.

A head gimbal assembly of the invention incorporates: a slider including the thin-film magnetic head of the invention and disposed to face toward a recording medium; and a suspension flexibly supporting the slider.

A head arm assembly of the invention incorporates: a slider including the thin-film magnetic head of the invention and disposed to face toward a recording medium; a suspension flexibly supporting the slider; and an arm for making the slider travel across tracks of the recording medium, the suspension being attached to the arm.

A magnetic disk drive of the invention incorporates: a slider including the thin-film magnetic head of the invention and disposed to face toward a recording medium that is driven to rotate; and an alignment device supporting the slider and aligning the slider with respect to the recording medium.

A magnetic sensor of the invention incorporates the first magnetoresistive element of the invention and a pair of electrodes for feeding a current for detecting the external magnetic field between the free layer and the pinned layer.

A second magnetoresistive element of the invention incorporates a layered structure including: a spacer layer having a first surface and a second surface that face toward opposite directions; a first ferromagnetic layer disposed adjacent to the first surface of the spacer layer; and a second ferromagnetic layer disposed adjacent to the second surface of the spacer layer. The second ferromagnetic layer has a coercivity higher than that of the first ferromagnetic layer. The spacer layer is a layer at least part of which is made of a material other than a conductor, and the spacer layer intercepts the passage of currents or limits the passage of currents as compared with a layer entirely made of a conductor. The layered structure has a peripheral surface formed of peripheral surfaces of the foregoing layers. The second magnetoresistive element of the invention further incorporates a conductive film that is disposed on the peripheral surface of the layered structure and allows conduction between the first and second ferromagnetic layers. In the second magnetoresistive element of the invention, a current is fed between the first and second ferromagnetic layers such that at least part of the current passes through the conductive film.

In the second magnetoresistive element of the invention, the conductive film may be made of a magnetic material. In this case, the conductive film preferably has a thickness smaller than or equal to 2 nm.

In the second magnetoresistive element of the invention, the conductive film may be made of a nonmagnetic material. In this case, the conductive film preferably has a thickness smaller than or equal to 20 nm.

A method of manufacturing the second magnetoresistive element of the invention includes the steps of: forming the layered structure; and forming the conductive film on the peripheral surface of the layered structure.

A magnetic memory of the invention incorporates a plurality of memory elements arranged in a matrix, and each of the memory elements is formed of the second magnetoresistive element of the invention. The magnetic memory of the invention further incorporates: a plurality of write lines for writing data on each of the memory elements; and a plurality of read lines for feeding a current for reading data from each of the memory elements between the first and second ferromagnetic layers of the magnetoresistive element as each of the memory elements.

According to the first magnetoresistive element of the invention, the conducting portion for allowing conduction between the free layer and the pinned layer is formed by the conductive film disposed on the peripheral surface of the layered structure. It is possible that, in this conducting portion, the width of the narrowest portion in the cross section intersecting the direction of passage of a current at a right angle coincides with the thickness of the conductive film. It is easier to control the small thickness of the conductive film than to control the small width of the film by photolithography. As a result, according to the first magnetoresistive element of the invention or the method of manufacturing the same, or any of the thin-film magnetic head, the head gimbal assembly, the head arm assembly, the magnetic disk drive, and the magnetic sensor each of which incorporates the first magnetoresistive element of the invention, it is easy to control the small width of the conducting portion for allowing conduction between the free layer and the pinned layer.

According to the second magnetoresistive element of the invention, the conducting portion for allowing conduction between the first and second ferromagnetic layers is formed by the conductive film disposed on the peripheral surface of the layered structure. It is possible that, in this conducting portion, the width of the narrowest portion in the cross section intersecting the direction of passage of a current at a right angle coincides with the thickness of the conductive film. It is easier to control the small thickness of the conductive film than to control the small width of the film by photolithography. As a result, according to the second magnetoresistive element of the invention or the method of manufacturing the same, or the magnetic memory that incorporates the second magnetoresistive element of the invention, it is easy to control the small width of the conducting portion for allowing conduction between the first and second ferromagnetic layers.

Other and further objects, features and advantages of the invention will appear more fully from the following description.

DETAILED DESCRIPTION OF THE PREFERRED EMBODIMENTS

First Embodiment

Figure 4:
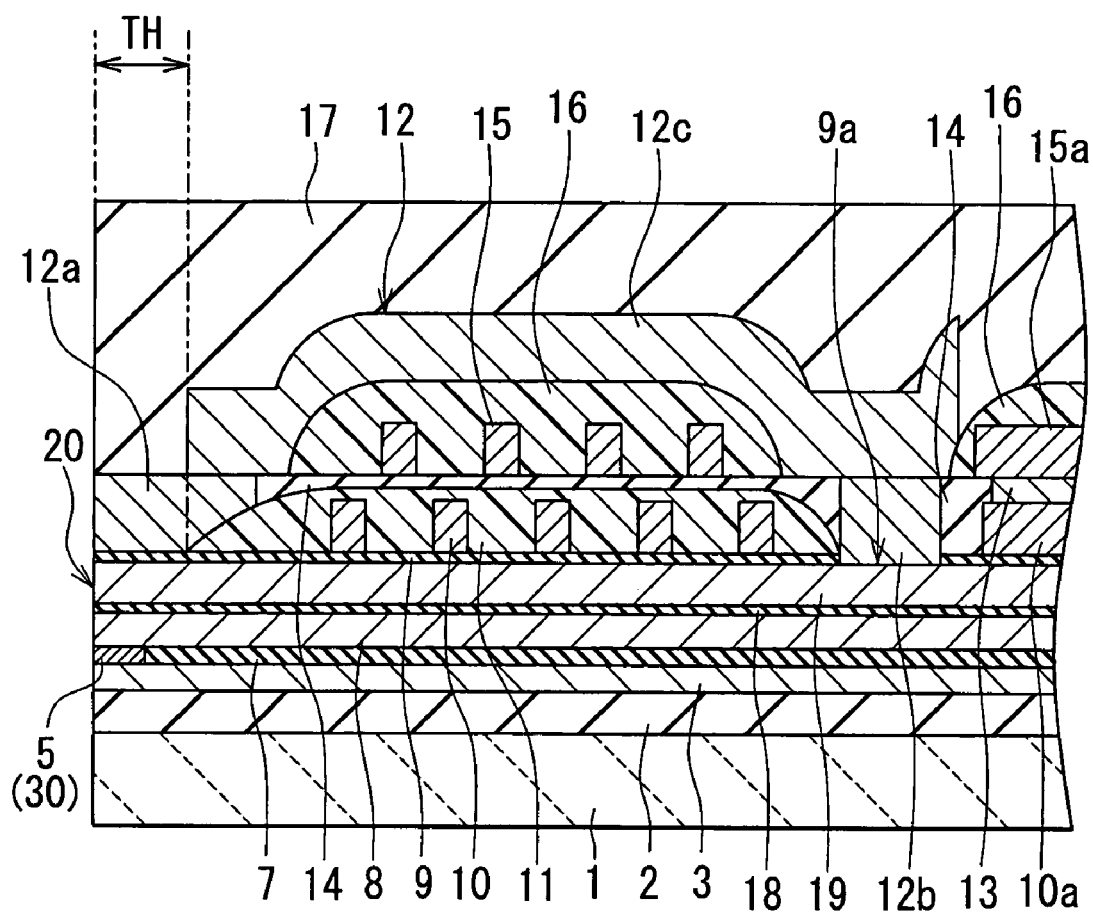
FIG. 4 is a cross-sectional view illustrating a cross section of a thin-film magnetic head of the first embodiment of the invention, the cross section being orthogonal to the medium facing surface and the substrate.
Figure 5:
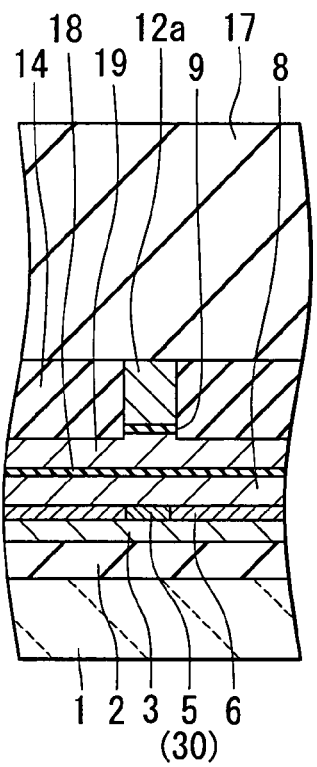
FIG. 5 is a cross-sectional view illustrating a cross section of a pole portion of the thin-film magnetic head of the first embodiment of the invention, the cross section being parallel to the medium facing surface.

Preferred embodiments of the invention will now be described in detail with reference to the accompanying drawings. Reference is now made to FIG. 4 and FIG. 5 to describe an outline of the configuration of a thin-film magnetic head of a first embodiment of the invention. FIG. 4 is a cross-sectional view illustrating a cross section of the thin-film magnetic head orthogonal to a medium facing surface and a substrate. FIG. 5 is a cross-sectional view illustrating a cross section of a pole portion of the thin-film magnetic head parallel to the medium facing surface.

The thin-film magnetic head of the embodiment has a medium facing surface 20 that faces toward a recording medium. The thin-film magnetic head incorporates: a substrate 1 made of a ceramic such as aluminum oxide and titanium carbide ($Al_2O_3$—TiC); an insulating layer 2 made of an insulating material such as alumina ($Al_2O_3$) and disposed on the substrate 1; a first shield layer 3 made of a magnetic material and disposed on the insulating layer 2; an MR element 5 disposed on the first shield layer 3; two bias field applying layers 6 disposed adjacent to the two sides of the MR element 5; and an insulating layer 7 disposed around the MR element 5 and the bias field applying layers 6. The MR element 5 is disposed near the medium facing surface 20. The insulating layer 7 is made of an insulating material such as alumina.

The thin-film magnetic head further incorporates: a second shield layer 8 made of a magnetic material and disposed on the MR element 5, the bias field applying layers 6 and the insulating layer 7; a separating layer 18 made of a nonmagnetic material such as alumina and disposed on the second shield layer 8; and a bottom pole layer 19 made of a magnetic material and disposed on the separating layer 18. The magnetic material used for the second shield layer 8 and the bottom pole layer 19 is a soft magnetic material such as NiFe, CoFe, CoFeNi or FeN. Alternatively, a second shield layer that also functions as a bottom pole layer may be provided in place of the second shield layer 8, the separating layer 18 and the bottom pole layer 19.

The thin-film magnetic head further incorporates a write gap layer 9 made of a nonmagnetic material such as alumina and disposed on the bottom pole layer 19. The write gap layer 9 has a contact hole 9a formed in a region away from the medium facing surface 20.

The thin-film magnetic head further incorporates a first layer portion 10 of a thin-film coil disposed on the write gap layer 9. The first layer portion 10 is made of a conductive material such as copper (Cu). In FIG. 4 numeral 10a indicates a connecting portion of the first layer portion 10 connected to a second layer portion 15 of the thin-film coil described later. The first layer portion 10 is wound around the contact hole 9a.

The thin-film magnetic head further incorporates: an insulating layer 11 made of an insulating material and disposed to cover the first layer portion 10 of the thin-film coil and the write gap layer 9 disposed around the first layer portion 10; a top pole layer 12 made of a magnetic material; and a connecting layer 13 made of a conductive material and disposed on the connecting portion 10a. The connecting layer 13 may be made of a magnetic material. Each of the outer and inner edge portions of the insulating layer 11 has a shape of rounded oblique surface.

The top pole layer 12 has a track width defining layer 12a, a coupling portion layer 12b and a yoke portion layer 12c. The track width defining layer 12a is disposed on regions of the write gap layer 9 and the insulating layer 11, the regions extending from an oblique portion of the insulating layer 11 closer to the medium facing surface 20 toward the medium facing surface 20. The track width defining layer 12a has: a front-end portion that is formed on the write gap layer 9 and functions as the pole portion of the top pole layer 12; and a connecting portion that is formed on the oblique portion of the insulating layer 11 closer to the medium facing surface 20 and is connected to the yoke portion layer 12c. The front-end portion has a width equal to the write track width. The connecting portion has a width greater than that of the front-end portion.

The coupling portion layer 12b is disposed on a region of the bottom pole layer 19 where the contact hole 9a is formed. The yoke portion layer 12c couples the track width defining layer 12a and the coupling portion layer 12b to each other. An end of the yoke portion layer 12c closer to the medium facing surface 20 is located at a distance from the medium facing surface 20. The yoke portion layer 12c is connected to the bottom pole layer 19 through the coupling portion layer 12b.

The thin-film magnetic head further incorporates an insulating layer 14 made of an inorganic insulating material such as alumina and disposed around the coupling portion layer 12b. The track width defining layer 12a, the coupling portion layer 12b, the connecting layer 13 and the insulating layer 14 have flattened top surfaces.

The thin-film magnetic head further incorporates the second layer portion 15 of the thin-film coil disposed on the insulating layer 14. The second layer portion 15 is made of a conductive material such as copper (Cu). In FIG. 4 numeral 15a indicates a connecting portion of the second layer portion 15 connected to the connecting portion 10a of the first layer portion 10 of the thin-film coil through the connecting layer 13. The second layer portion 15 is wound around the coupling portion layer 12b.

The thin-film magnetic head further incorporates an insulating layer 16 disposed to cover the second portion layer 15 of the thin-film coil and the insulating layer 14 around the second portion layer 15. Outer and inner edge portions of the insulating layer 16 each have a shape of a rounded oblique surface. A portion of the yoke portion layer 12c is located on the insulating layer 16.

The thin-film magnetic head further incorporates an overcoat layer 17 disposed to cover the top pole layer 12. The overcoat layer 17 is made of alumina, for example.

The outline of the method of manufacturing the thin-film magnetic head of the embodiment will now be described. In the method, first, components of a plurality of magnetic heads are formed on a single substrate, and a magnetic head substructure in which pre-head portions that will be the respective magnetic heads later are aligned in a plurality of rows is thereby fabricated. The step of fabricating the magnetic head substructure will now be described, focusing on one of the pre-head portions.

In the step of fabricating the magnetic head substructure, first, the insulating layer 2 having a thickness of 0.2 to 5 μm, for example, is formed on the substrate 1 by a method such as sputtering. Next, the first shield layer 3 is formed into a predetermined pattern on the insulating layer 2 by a method such as plating. Next, although not shown, an insulating layer of alumina, for example, is formed over the entire surface. Next, the insulating layer is polished by chemical mechanical polishing (CMP), for example, so that the first shield layer 3 is exposed, and the top surfaces of the first shield layer 3 and the insulating layer are thereby flattened.

Next, a layered structure 30 that is part of the MR element 5, the two bias field applying layers 6, and the insulating layer 7 are formed on the first shield layer 3. The layered structure 30 will be described in detail later.

Next, the second shield layer 8 is formed on the layered structure 30, the bias field applying layers 6 and the insulating layer 7. The second shield layer 8 is formed by plating or sputtering, for example. Next, the separating layer 18 is formed by sputtering, for example, on the second shield layer 8. Next, the bottom pole layer 19 is formed on the separating layer 18 by plating or sputtering, for example.

Next, the write gap layer 9 having a thickness of 50 to 300 nm, for example, is formed on the bottom pole layer 19 by a method such as sputtering. Next, to make a magnetic path, a portion of the write gap layer 9 is etched to form the contact hole 9a in a center portion of the thin-film coil that will be formed later.

Next, the first layer portion 10 of the thin-film coil having a thickness of 2 to 3 μm, for example, is formed on the write gap layer 9. The first layer portion 10 is wound around the contact hole 9a.

Next, the insulating layer 11 having a specific pattern is formed to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is performed at a specific temperature to flatten the surface of the insulating layer 11. Through this heat treatment, each of the outer and inner edge portions of the insulating layer 11 is made to have a shape of rounded oblique surface.

Next, the track width defining layer 12*a* of the top pole layer 12 is formed on regions of the write gap layer 9 and the insulating layer 11, the regions extending from the oblique portion of the insulating layer 11 closer to the medium facing surface 20 described later toward the medium facing surface 20.

When the track width defining layer 12*a* is formed, the coupling portion layer 12*b* is formed on the region of the bottom pole layer 19 where the contact hole 9*a* is formed, and the connecting layer 13 is formed on the connecting portion 10*a* at the same time.

Next, pole trimming is performed. That is, in a region around the track width defining layer 12*a*, the write gap layer 9 and at least a portion of the pole portion of the bottom pole layer 19 close to the write gap layer 9 are etched using the track width defining layer 12*a* as a mask. As a result, as shown in FIG. 5, a trim structure is formed, wherein the pole portion of the top pole layer 12, the write gap layer 9 and at least a portion of the pole portion of the bottom pole layer 19 have equal widths. The trim structure prevents an increase in effective track width resulting from an expansion of magnetic flux near the write gap layer 9.

Next, the insulating layer 14 having a thickness of 3 to 4 μm, for example, is formed over the entire top surface of the layered structure formed through the foregoing steps. The insulating layer 14 is then polished by CMP, for example, to reach the surfaces of the track width defining layer 12*a*, the coupling portion layer 12*b* and the connecting layer 13, and flattened.

Next, the second layer portion 15 of the thin-film coil having a thickness of 2 to 3 μm, for example, is formed on the flattened insulating layer 14. The second layer portion 15 is wound around the coupling portion layer 12*b*.

Next, the insulating layer 16 having a specific pattern is formed to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is performed at a specific temperature to flatten the surface of the insulating layer 16. Through this heat treatment, each of the outer and inner edge portions of the insulating layer 16 is made to have a shape of rounded oblique surface. Next, the yoke portion layer 12*c* is formed on the track width defining layer 12*a*, the insulating layers 14 and 16, and the coupling portion layer 12*b*.

Next, the overcoat layer 17 is formed to cover the entire top surface of the layered structure formed through the foregoing steps. Next, wiring and terminals and so on are formed on the overcoat layer 17, and the magnetic head substructure is thus completed.

In the following step of the method of manufacturing the thin-film magnetic head of the embodiment, the substructure is cut to fabricate a head aggregate including a plurality of pre-head portions aligned in a row. Next, a surface formed in the head aggregate by cutting the substructure is lapped to form a lapped surface of each of the pre-head portions that the head aggregate includes. Next, a conductive film to be part of the MR element 5 is formed on a portion of the lapped surface. The MR element 5 is thereby completed. The conductive film will be described in detail later. Next, a protection film may be formed to cover the lapped surface and the conductive film. In the case in which the protection film is formed, a surface of the protection film becomes the medium facing surface 20. In the case in which the protection film is not formed, a portion of the lapped surface that is not covered with the conductive film and the surface of the conductive film constitute the medium facing surface 20. Next, flying rails are formed in each medium facing surface 20. Next, the head aggregate is cut so that the plurality of pre-head portions are separated from one another, and the plurality of thin-film magnetic heads are thus completed.

The thin-film magnetic head thus manufactured incorporates the medium facing surface 20 that faces toward a recording medium, the read head and the write head. The configuration of the read head will be described in detail later.

The write head incorporates the bottom pole layer 19 and the top pole layer 12 that are magnetically coupled to each other and include the pole portions that are opposed to each other and placed in regions on a side of the medium facing surface 20. The write head further incorporates: the write gap layer 9 provided between the pole portion of the bottom pole layer 19 and the pole portion of the top pole layer 12; and the thin-film coil including the portions 10 and 15 at least part of which is placed between the bottom pole layer 19 and the top pole layer 12 and insulated from the bottom pole layer 19 and the top pole layer 12. In the thin-film magnetic head, as shown in FIG. 4, the length from the medium facing surface 20 to the end of the insulating layer 11 closer to the medium facing surface 20 corresponds to throat height TH. The throat height refers to the length (height) from the medium facing surface 20 to the point at which the distance between the two pole layers starts to increase. Although the write head shown in FIG. 4 and FIG. 5 is one designed for a longitudinal magnetic recording system, the write head of the embodiment may be one designed for a perpendicular magnetic recording system.

Figure 1:
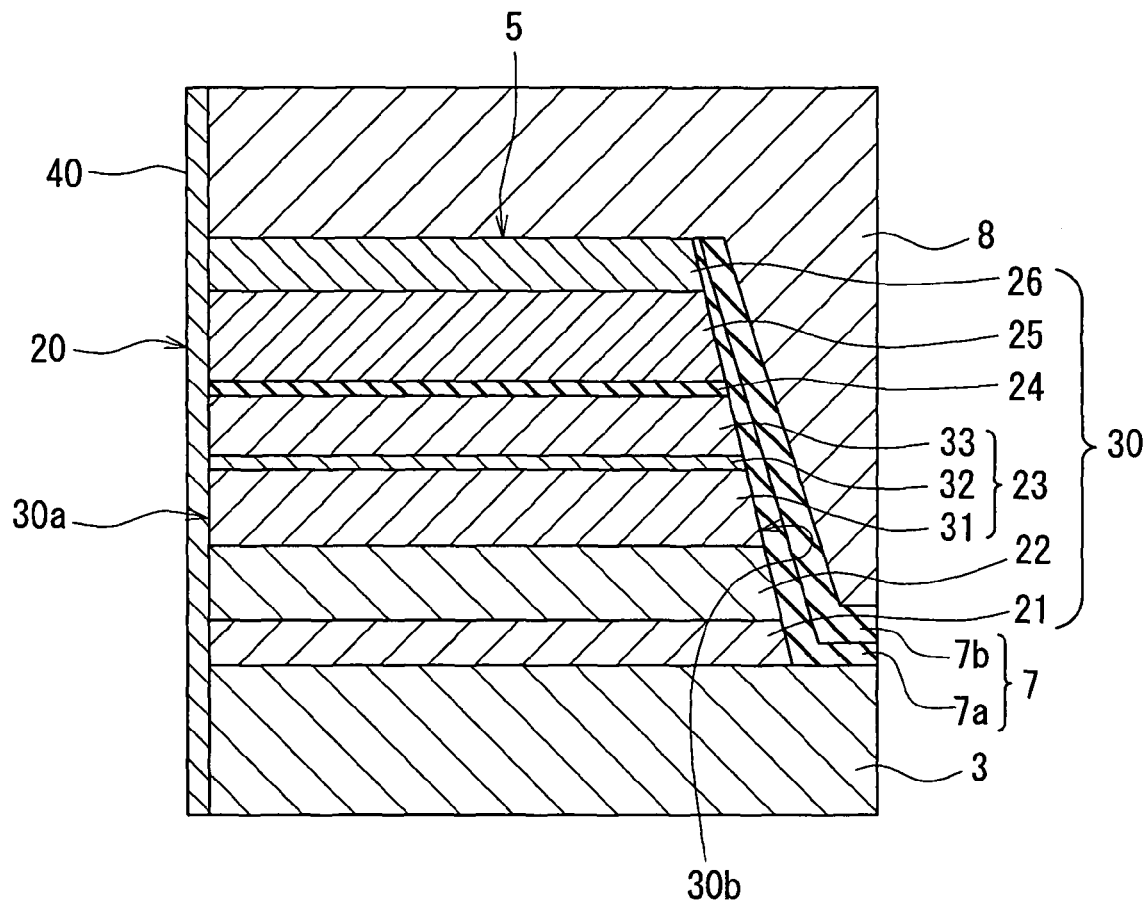
FIG. 1 is a cross-sectional view illustrating a cross section of a read head of a first embodiment of the invention, the cross section being orthogonal to a medium facing surface and a substrate.
Figure 2:
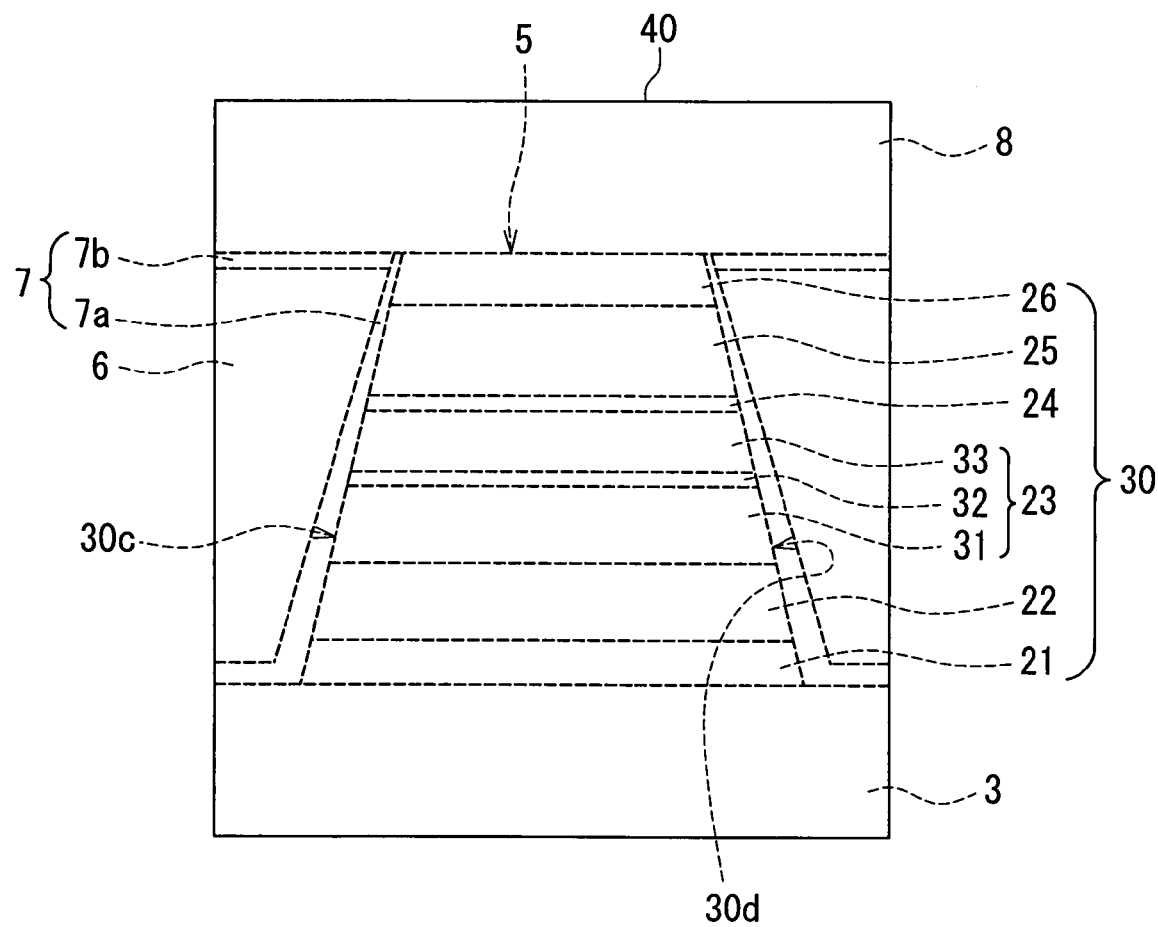
FIG. 2 is a front view illustrating the medium facing surface of the read head of the first embodiment of the invention.
Figure 3:
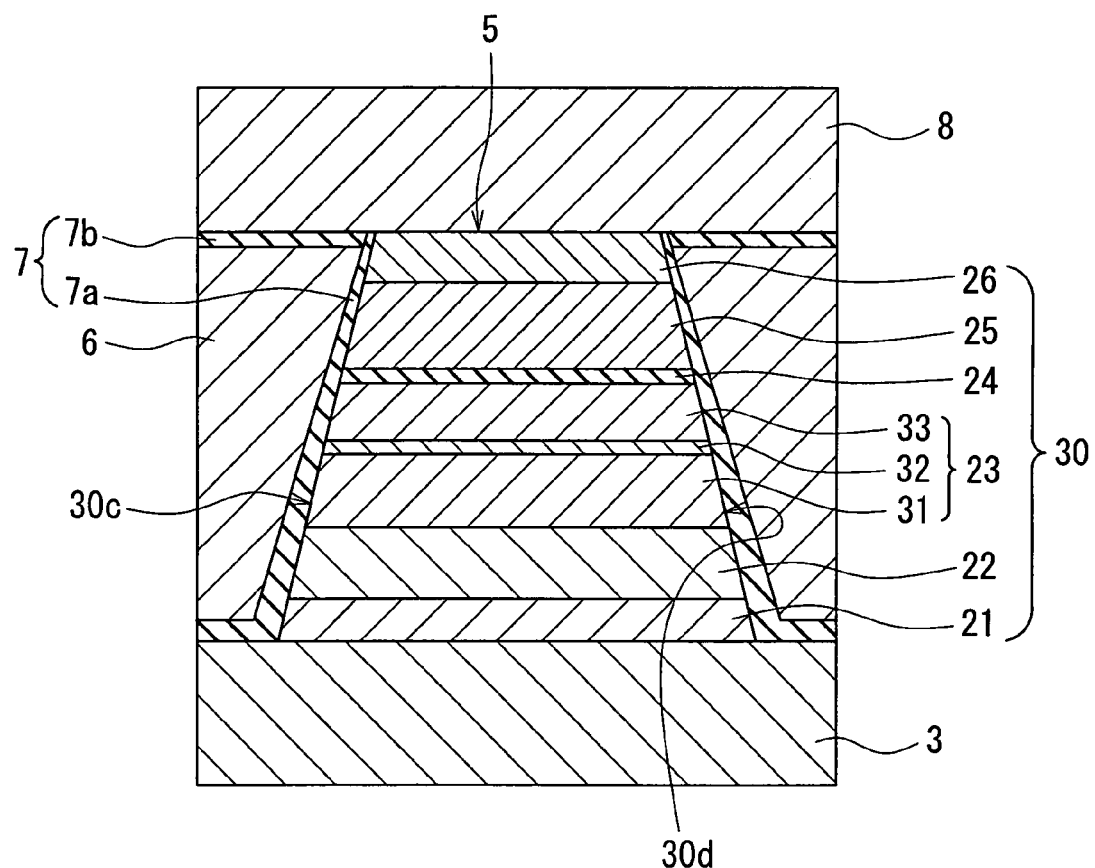
FIG. 3 is a cross-sectional view illustrating a cross section of the read head of the first embodiment of the invention, the cross section being parallel to the medium facing surface.

Reference is now made to FIG. 1 to FIG. 3 to describe the details of the configuration of the read head of the embodiment. FIG. 1 is a cross-sectional view of the read head orthogonal to the medium facing surface and the plane of the substrate. FIG. 2 is a front view of the medium facing surface of the read head. FIG. 3 is a cross-sectional view of the read head parallel to the medium facing surface.

As shown in FIG. 1 to FIG. 3, the read head incorporates: the first shield layer 3 and the second shield layer 8 disposed with a specific space from each other; and the layered structure 30 disposed between the first shield layer 3 and the second shield layer 8. The layered structure 30 makes up a portion of the MR element 5. The layered structure 30 and the second shield layer 8 are stacked on the first shield layer 3.

The read head further incorporates: the two bias field applying layers 6 that are disposed adjacent to the two sides of the layered structure 30 and that apply a bias magnetic field to the layered structure 30; and the insulating layer 7 disposed around the layered structure 30 and the bias field applying layers 6. The bias field applying layers 6 are each made of a hard magnetic layer (hard magnet) or a layered structure made up of ferromagnetic layers and antiferromagnetic layers, for example. To be specific, the bias field applying layers 6 are made of CoPt or CoCrPt, for example. The insulating layer 7 incorporates insulating films 7*a* and 7*b*. The insulating film 7*a* is placed between the bias field applying layers 6 and each of the first shield layer 3 and the layered structure 30 and insulates the bias field applying layers 6 from each of the first shield layer 3 and the layered structure 30. The insulating film 7*b* is placed between the second shield layer 8 and the bias field applying layers 6 and insulates the bias field applying layers 6 from the second shield layer 8. The insulating films 7a and 7b are made of alumina, for example. It is not absolutely necessary to provide the insulating film 7b.

FIG. 1 to FIG. 3 illustrate an example of configuration of the MR element 5. As previously described, the MR element 5 incorporates the layered structure 30. The layered structure 30 incorporates: a spacer layer 24 having a first surface (top surface) and a second surface (bottom surface) that face toward opposite directions; a free layer 25 that is a ferromagnetic layer disposed adjacent to the first surface of the spacer layer 24 and having a direction of magnetization that changes in response to a signal magnetic field; and a pinned layer 23 that is a ferromagnetic layer disposed adjacent to the second surface of the spacer layer 24 and having a fixed direction of magnetization. In the example shown in FIG. 1 to FIG. 3, the pinned layer 23 is located closer to the first shield layer 3 than the free layer 25. However, the reverse is possible, that is, the free layer 25 may be located closer to the first shield layer 3.

The layered structure 30 further incorporates: an antiferromagnetic layer 22 disposed on a side of the pinned layer 23 farther from the spacer layer 24; an underlying layer 21 disposed between the first shield layer 3 and the antiferromagnetic layer 22; and a protection layer 26 disposed between the free layer 25 and the second shield layer 8. In the MR element 5 of FIG. 1 to FIG. 3, the underlying layer 21, the antiferromagnetic layer 22, the pinned layer 23, the spacer layer 24, the free layer 25, and the protection layer 26 are stacked in this order on the first shield layer 3.

The layered structure 30 has a peripheral surface made up of the peripheral surfaces of the layers 21 to 26. The plane geometry of each of the layers 21 to 26 is rectangular. The peripheral surface of the layered structure 30 includes: a first side surface 30a facing toward the medium facing surface 20; a second side surface 30b opposite to the first side surface 30a; and a third side surface 30c and a fourth side surface 30d that couple the first side surface 30a and the second side surface 30b to each other. The first side surface 30a is a portion of the lapped surface formed in the pre-head portion when one of the surfaces of the head aggregate is lapped.

The antiferromagnetic layer 22 is a layer that fixes the direction of magnetization of the pinned layer 23 by exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The protection layer 26 is a layer for protecting the layers therebelow.

The underlying layer 21 has a thickness of 2 to 6 nm, for example. The underlying layer 21 is made of a layered structure made up of a Ta layer and an Ru layer, for example.

The antiferromagnetic layer 22 has a thickness of 5 to 30 nm, for example, and may be made of an antiferromagnetic material containing Mn and at least one element $M_{II}$ selected from the group consisting of Pt, Ru, Rh, Pd, Ni, Cu, Ir, Cr and Fe. The Mn content preferably falls within a range of 35 to 95 atomic % inclusive. The content of the other element $M_{II}$ preferably falls within a range of 5 to 65 atomic % inclusive. One type of antiferromagnetic material is a non-heat-induced antiferromagnetic material that exhibits antiferromagnetism without any heat treatment and that induces an exchange coupling magnetic field between a ferromagnetic material and itself. Another type of antiferromagnetic material is a heat-induced antiferromagnetic material that exhibits antiferromagnetism when heat treatment is given. The antiferromagnetic layer 22 may be made of either of these types. The non-heat-induced antiferromagnetic materials include an Mn alloy that has a γ phase, such as RuRhMn, FeMn, and IrMn. The heat-induced antiferromagnetic materials include an Mn alloy that has a regular crystal structure, such as PtMn, NiMn, and PtRhMn.

As the layer for fixing the direction of magnetization of the pinned layer 23, a hard magnetic layer made of a hard magnetic material such as CoPt may be provided in place of the antiferromagnetic layer 22 described above. In such a case, the material of the underlying layer 21 is Cr, CrTi or TiW, for example.

The direction of magnetization is fixed in the pinned layer 23 by means of the exchange coupling at the interface between the antiferromagnetic layer 22 and the pinned layer 23. The pinned layer 23 of the embodiment is a so-called synthetic pinned layer, incorporating an outer layer 31, a nonmagnetic middle layer 32 and an inner layer 33 that are stacked in this order on the antiferromagnetic layer 22. Each of the inner layer 33 and the outer layer 31 includes a ferromagnetic layer made of a ferromagnetic material containing at least Co selected from the group consisting of Co and Fe. The inner layer 33 and the outer layer 31 are antiferromagnetically coupled to each other and the directions of magnetization thereof are fixed to opposite directions. The outer layer 31 has a thickness of 3 to 7 nm, for example. The inner layer 33 has a thickness of 3 to 10 nm, for example.

The nonmagnetic middle layer 32 has a thickness of 0.35 to 1.0 nm, for example, and may be made of a nonmagnetic material containing at least one element selected from the group consisting of Ru, Rh, Ir, Re, Cr, Zr and Cu. The nonmagnetic middle layer 32 is provided for creating antiferromagnetic exchange coupling between the inner layer 33 and the outer layer 31, and for fixing the magnetizations of these layers to opposite directions. The magnetizations of the inner layer 33 and the outer layer 31 in opposite directions include not only the case in which there is a difference of 180 degrees between these directions of magnetizations, but also the case in which there is a difference of 180±20 degrees between them.

The spacer layer 24 is a layer at least part of which is made of a material other than a conductor, and the spacer layer 24 intercepts the passage of currents or limits the passage of currents as compared with a layer entirely made of a conductor. For example, the spacer layer 24 may be a layer entirely made of an insulating material. In this case, the spacer layer 24 may be a layer that completely intercepts the passage of currents, or may be a tunnel barrier layer that allows electrons to pass therethrough while the electrons maintain spins by means of the tunnel effect. Even in the case where the spacer layer 24 is a tunnel barrier layer, the spacer layer 24 limits the passage of currents as compared with a layer entirely made of a conductor. In the case where the spacer layer 24 is a tunnel barrier layer, the spacer layer 24 has a thickness of 0.5 to 2 nm, for example. In the case where the spacer layer 24 is a tunnel barrier layer, the spacer layer 24 is made of an oxide or a nitride of Al, Ni, Gd, Mg, Ta, Mo, Ti, W, Hf or Zr, for example.

The spacer layer 24 may be a current-confined layer having a plurality of minute conductive portions that penetrate in the direction of thickness, and insulating portions that separate the conductive portions from one another. The spacer 24 may be made of a material containing a semiconductor.

The free layer 25 has a thickness of 2 to 10 nm, for example. The free layer 25 is formed of a ferromagnetic layer having a low coercivity. The free layer 25 may include a plurality of ferromagnetic layers that are stacked.

The protection layer 26 has a thickness of 0.5 to 10 nm, for example. A Ta layer or an Ru layer may be used as the protection layer 26. The protection layer 26 may have a two-layer structure made up of a combination of layers such as a Ta layer and an Ru layer, or a three-layer structure made up of a combination of a Ta layer, an Ru layer and a Ta layer or a combination of an Ru layer, a Ta layer and an Ru layer, for example.

The MR element 5 incorporates a conductive film 40 that is disposed on the peripheral surface of the layered structure 30 and that allows conduction between the free layer 25 and the pinned layer 23. In the embodiment the conductive film 40 is disposed on the first side surface 30a that is a portion of the peripheral surface of the layered structure 30 facing toward the medium facing surface 20. Therefore, the conductive film 40 is located between the medium facing surface 20 and the portion of the peripheral surface of the layered structure 30 facing toward the medium facing surface 20.

The conductive film 40 may have any shape and size as long as it is capable of allowing conduction between the free layer 25 and the pinned layer 23. In the example of FIG. 1 and FIG. 2, the conductive film 40 is located in a region that touches the entire first side surface 30a of the layered structure 30, and the shield layers 3 and 8, the insulating layer 7 and the bias field applying layers 6 that are located around the first side surface 30a.

It suffices that the material of the conductive film 40 is a conductive one. The material of the conductive film 40 may be a magnetic material or a nonmagnetic material. A magnetic material forming the conductive film 40 may be a magnetic metallic material containing at least one element selected from the group consisting of Fe, Co and Ni, for example. A nonmagnetic material forming the conductive film 40 may be a nonmagnetic metallic material containing at least one element selected from the group consisting of Ru, Rh, Ir, Re, Cr, Zr, Cu, Ag, Al, Au, Mg, Mn, Nb, Pd, Pt, Ta, Ti and V.

The MR element 5 has a resistance that changes in response to an external magnetic field, that is, a signal magnetic field from a recording medium. The first and second shield layers 3 and 8 are used to feed the MR element 5 a sense current for detecting the signal magnetic field from the recording medium. It is possible to obtain the resistance of the MR element 5 from the sense current. It is thereby possible to read data written on the medium by using the read head. The shield layers 3 and 8 correspond to the pair of electrodes of the invention. Since the read head incorporates the MR element 5 and the shield layers 3 and 8 as the pair of electrodes, the read head also serves as a magnetic sensor of the embodiment.

In the MR element 5 of the embodiment, the sense current is fed between the shield layers 3 and 8 in the direction in which the layers of the layered structure 30 are stacked. As a result, the sense current is fed between the free layer 25 and the pinned layer 23 such that at least part of the sense current passes through the conductive film 40.

A method of manufacturing the MR element 5 of FIG. 1 to FIG. 3 will now be described. The method includes the step of forming the layered structure 30 and the step of forming the conductive film 40 on the peripheral surface of the layered structure 30.

In the step of forming the layered structure 30, first, films that will be the layers constituting the layered structure 30 of the MR element 5 are formed one by one on the first shield layer 3 by sputtering, for example. Next, these films are patterned by etching to form the layered structure 30.

The step of forming the conductive film 40 is performed after the step of forming the lapped surface of each of the pre-head portions that the head aggregate includes, as previously described. For example, the conductive film 40 may be formed by a first method or a second method that will now be described.

In the first method, for example, a film to be the conductive film 40 is formed on the front of the lapped surface by sputtering, for example. Next, a mask patterned by photolithography is formed on this film. The shape of this mask corresponds to the shape of the conductive film 40 to be formed. Next, the film to be the conductive film 40 except a portion thereof covered with the mask is removed by etching. The mask is then removed. The film that thereby remains becomes the conductive film 40.

In the second method, first, a mask patterned by photolithography is formed on the lapped surface. The mask has an opening formed in a region where the conductive film 40 is to be formed. Next, a film to be the conductive film 40 is formed on the mask and in the opening of the mask by sputtering, for example. The mask is then lifted off. The film that thereby remains on the lapped surface becomes the conductive film 40.

The operation of the thin-film magnetic head of the embodiment will now be described. The thin-film magnetic head writes data on a recording medium by using the write head and reads data written on the recording medium by using the read head.

In the read head, the direction of the bias magnetic field created by the bias field applying layers 6 intersects the direction orthogonal to the medium facing surface 20 at a right angle. In the MR element 5 the direction of magnetization of the free layer 25 is aligned with the direction of the bias field when no signal magnetic field exists. The direction of magnetization of the pinned layer 23 is fixed to the direction orthogonal to the medium facing surface 20.

A sense current is fed to the MR element 5 by the first and second shield layers 3 and 8. The sense current is fed between the shield layers 3 and 8 in the direction in which the layers of the layered structure 30 are stacked. As a result, the sense current is fed between the free layer 25 and the pinned layer 23 such that at least part of the sense current passes through the conductive film 40. In the case in which the spacer layer 24 is a layer that completely intercepts the passage of currents, the entire sense current flowing between the free layer 25 and the pinned layer 23 passes through the conductive-film 40. In the case in which the spacer layer 24 is not a layer that completely intercepts the passage of currents, part of the sense current flowing between the free layer 25 and the pinned layer 23 passes through the conductive film 40 while the remainder of the sense current flowing between the free layer 25 and the pinned layer 23 passes through the spacer layer 24.

In the MR element 5 of the embodiment, a conducting portion that allows conduction between the free layer 25 and the pinned layer 23 is formed by the conductive film 40 disposed on the first side surface 30a of the layered structure 30. In this conducting portion, the width of a narrowest portion in a cross section intersecting the direction of passage of currents at a right angle coincides with the thickness of the conductive film 40. In the MR element 5 of the embodiment, there is obtained a magnetoresistive effect resulting from at least the structure in which there is conduction between the free layer 25 and the pinned layer 23 through the conductive film 40.

It is assumed that, in the case in which the conductive film 40 is made of a magnetic material, the above-mentioned magnetoresistive effect is produced in accordance with a principle the same as that of a quantum MR element. In this case, to achieve a great magnetoresistive effect, it is assumed that it is preferred that the width of the narrowest portion in a cross section of the conducting portion formed by the conductive film 40, that is, the thickness of the conductive film 40, be as small as possible. To be specific, the thickness of the conductive film 40 is preferably greater than zero and smaller than or equal to 2 nm. The thickness of the conductive film 40 greater than zero means that it suffices that the conductive film 40 exists. Therefore, it suffices that the thickness of the conductive film 40 is equal to or greater than the size of each atom forming the conductive film 40.

It is assumed that, in the case in which the conductive film 40 is made of a nonmagnetic material, the above-mentioned magnetoresistive effect is produced in accordance with a principle the same as the magnetoresistive effect produced by a current-confined layer. In this case, to achieve a great magnetoresistive effect, it is preferred that currents flow intensively in the conducting portion formed by the conductive film 40. In this case, the width of the narrowest portion in a cross section of the conducting portion formed by the conductive film 40, that is, the thickness of the conductive film 40, is preferably greater than zero and smaller than or equal to 20 nm.

In the MR element 5 of the embodiment, in addition to the magnetoresistive effect resulting from the structure in which there is conduction between the free layer 25 and the pinned layer 23 through the conductive film 40, there may occur a magnetoresistive effect resulting from the structure in which the spacer layer 24 is disposed between the free layer 25 and the pinned layer 23. For example, in the case in which the spacer layer 24 is a tunnel barrier layer or a current-confined layer, there is produced a magnetoresistive effect resulting from the structure in which the spacer layer 24 is disposed between the free layer 25 and the pinned layer 23. As thus described, in the case in which two types of magnetoresistive effect are produced in the MR element 5, the entire magnetoresistive effect of the MR element 5 is a combination of the two types.

In the MR element 5, the direction of magnetization of the free layer 25 changes in response to the signal field sent from the recording medium. The relative angle between the direction of magnetization of the free layer 25 and the direction of magnetization of the pinned layer 23 is thereby changed. As a result, the resistance of the MR element 5 changes due to the above-described magnetoresistive effect. The resistance of the MR element 5 is obtained from the potential difference between the first and second shield layers 3 and 8 when a sense current is fed to the MR element 5 from the shield layers 3 and 8. In such a manner, the data stored on the recording medium is read by the read head.

A description will now be given of an experiment performed to confirm that, in the MR element 5 of the embodiment, the magnetoresistive effect results from the structure in which there is conduction between the free layer 25 and the pinned layer 23 through the conductive film 40.

In this experiment, a reference MR element and MR elements of first to fourth examples of the embodiment were fabricated, and the resistances and the MR ratios thereof were measured. The MR ratio is a ratio of magetoresistance change with respect to the resistance.

The reference MR element and the MR elements of the first to fourth examples of the embodiment incorporate the layered structures 30 having the same configurations. Table 1 below shows the configuration of the layered structure 30.

TABLE 1

| Layer | | Substance | Thickness (nm) |
|---|---|---|---|
| Protection layer | | Ta | 5 |
| Free layer | | NiFe | 5 |
| | | CoFe | 1 |
| Spacer layer | | Aluminum oxide | 1.5 to 2.0 |

TABLE 1-continued

| Layer | | Substance | Thickness (nm) |
|---|---|---|---|
| Pinned layer | Inner layer | CoFe | 3 |
| | Nonmagnetic middle layer | Ru | 0.8 |
| | Outer layer | CoFe | 3 |
| Antiferromagnetic layer | | IrMn | 7 |
| Underlying layer | | Ru | 2 |
| | | Ta | 1 |

In the layered structure 30 having the configuration shown in Table 1, the spacer layer 24 is an aluminum oxide layer formed by oxidizing an Al layer having a thickness of 0.5 nm.

The reference MR element does not incorporate the conductive film 40. In contrast, the MR elements of the first to fourth examples of the embodiment each incorporate the conductive film 40 disposed on the first side surface 30a of the layered structure 30. The conductive film 40 of each of the MR elements of the first and second examples is made of NiFe that is a magnetic material. The thickness of the conductive film 40 of the first example is 0.2 nm. The thickness of the conductive film 40 of the second example is 0.4 nm. The conductive film 40 of each of the MR elements of the third and fourth examples is made of Cu that is a nonmagnetic material. The thickness of the conductive film 40 of the third example is 0.2 nm. The thickness of the conductive film 40 of the fourth example is 0.4 nm.

In this experiment the reference MR element and the MR elements of the first to fourth examples of the embodiment were fabricated in the following manner. First, a magnetic head substructure including the layered structure having the configuration of Table 1 was fabricated, and then the substructure was cut to fabricate a head aggregate. Since the lapped surface had not been formed in each of the pre-head portions included in the head aggregate at that point, the first side surface 30a facing toward the medium facing surface 20 was not yet formed in the layered structure. However, the other side surfaces 30b, 30c and 30d had been formed in the layered structure at that point. In the layered structure at that point, the plane geometry of the spacer layer 24 was a rectangle whose length taken in the direction of track width was 0.06 µm and whose length taken in the direction orthogonal to the medium facing surface 20 was 0.5 µm. The resistance and the MR ratio of the layered structure at that point were measured to find out that the resistance was approximately 100 kΩ and the MR ratio was zero.

In the experiment the one surface formed in the head aggregate by cutting the substructure was then polished to form the lapped surface in each of the pre-head portions included in the head aggregate. The layered structure 30 having the configuration of Table 1 was thereby completed. In the layered structure 30 the first side surface 30a is a portion of the above-mentioned lapped surface. In the layered structure 30, the plane geometry of the spacer layer 24 is a rectangle whose length taken in the direction of track width is 0.06 µm and whose length taken in the direction orthogonal to the medium facing surface 20 is 0.1 µm.

When the reference MR element was fabricated, a protection film was formed to cover the first side surface 30a of the layered structure 30 instead of forming the conductive film 40 on the first side surface 30a. The protection film was formed by stacking an Si film and a diamond-like-carbon (DLC) film in this order on the first side surface 30a.

When the MR element of each of the first to fourth examples of the embodiment was fabricated, the conductive film 40 made of a material previously mentioned and having a thickness previously mentioned was formed on the first side surface 30a of the layered structure 30, and then a protection film was formed to cover the conductive film 40. The protection film was an aluminum oxide film.

Table 2 below shows the resistance and the MR ratio of the reference MR element, and the material and thickness of the conductive film 40, the resistance and the MR ratio of each of the MR element of the first to fourth examples of the embodiment.

TABLE 2

| | Material of conductive film | Thickness of conductive film (nm) | Resistance (Ω) | MR ratio (%) |
|---|---|---|---|---|
| Reference | None | None | 489115 | 0 |
| First example | NiFe | 0.2 | 261 | 13.1 |
| Second example | NiFe | 0.4 | 130 | 6.8 |
| Third example | Cu | 0.2 | 32.9 | 5.5 |
| Fourth example | Cu | 0.4 | 20.3 | 2.0 |

As shown in Table 2, while the MR ratio of the reference MR element was zero, an MR ratio of a certain degree was obtained for the MR element of each of the first to fourth examples of the embodiment. This indicates that the magnetoresistive effect results from the structure in which there is conduction between the free layer 25 and the pinned layer through the conductive film 40.

It is assumed that it is possible for the MR element 5 of the embodiment to achieve an MR ratio higher than the MR ratio of each of the examples shown in Table 2 by improving the state of the interface between the first side surface 30a and the conductive film 40 and/or by optimizing the material and the thickness of the conductive film 40.

According to the MR element 5 of the embodiment as thus described, the conducting portion for allowing conduction between the free layer 25 and the pinned layer 23 is formed by the conductive film 40 disposed on the peripheral surface of the layered structure 30. It is possible that, in this conducting portion, the width of the narrowest portion in the cross section intersecting the direction of passage of currents at a right angle coincides with the thickness of the conductive film 40. It is easier to control the small thickness of the conductive film 40 than to control the small width of the film by photolithography. As a result, according to the MR element 5 of the embodiment or the method of manufacturing the same, or the thin-film magnetic head or the magnetic sensor (read head) that incorporates the MR element 5 of the embodiment, it is easy to control the small width of the conducting portion for allowing conduction between the free layer 25 and the pinned layer 23. Furthermore, it is thereby possible to manufacture the MR element 5 having a desired magnetoresistive effect, or the thin-film magnetic head or the magnetic sensor that incorporates the MR element 5 with reliability.

Figure 6:
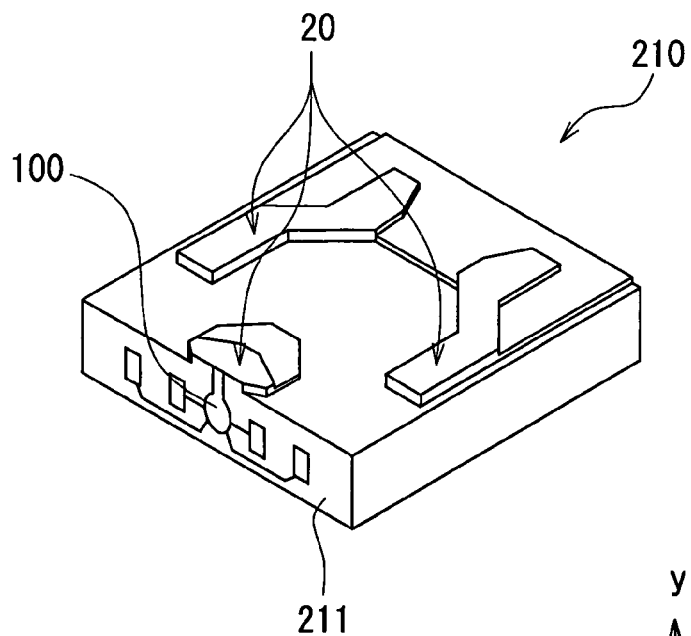
FIG. 6 is a perspective view illustrating a slider that a head gimbal assembly of the first embodiment of the invention includes.

A head gimbal assembly, a head arm assembly and a magnetic disk drive of the embodiment will now be described. Reference is made to FIG. 6 to describe a slider 210 incorporated in the head gimbal assembly. In the magnetic disk drive the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 4. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 6, an airflow passes between the magnetic disk platter and the slider 210, and a lift is thereby generated below the slider 210 in the y direction of FIG. 6 and exerted on the slider 210. The slider 210 flies over the magnetic disk platter by means of the lift. The x direction of FIG. 6 is across the tracks of the magnetic disk platter. The thin-film magnetic head 100 of the embodiment is formed near the air-outflow-side end (the end located at the lower left of FIG. 6) of the slider 210.

Figure 7:
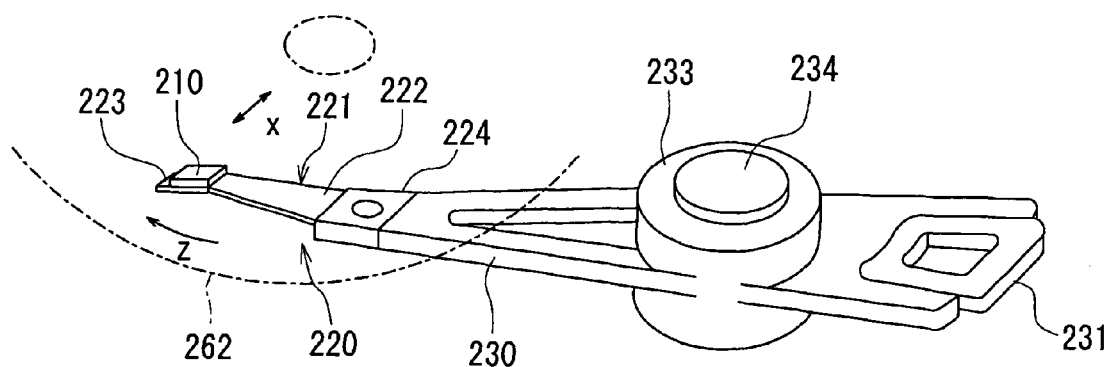
FIG. 7 is a perspective view illustrating a head arm assembly of the first embodiment of the invention.

Reference is now made to FIG. 7 to describe the head gimbal assembly 220 of the embodiment. The head gimbal assembly 220 comprises the slider 210 and a suspension 221 that flexibly supports the slider 210. The suspension 221 incorporates: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator incorporates the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly comprising the arm 230 and the head gimbal assembly 220 attached to the arm 230 is called a head arm assembly. An assembly comprising a carriage having a plurality of arms wherein the head gimbal assembly 220 is attached to each of the arms is called a head stack assembly.

FIG. 7 illustrates the head arm assembly of the embodiment. In the head arm assembly the head gimbal assembly 220 is attached to an end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 8:
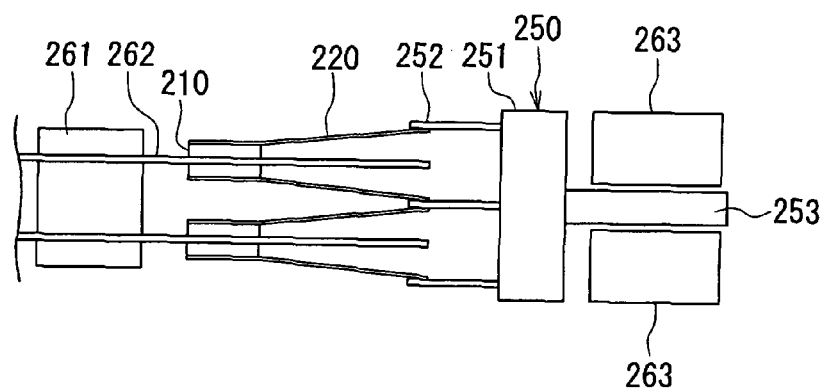
FIG. 8 is a view for illustrating a main part of a magnetic disk drive of the first embodiment of the invention.
Figure 9:
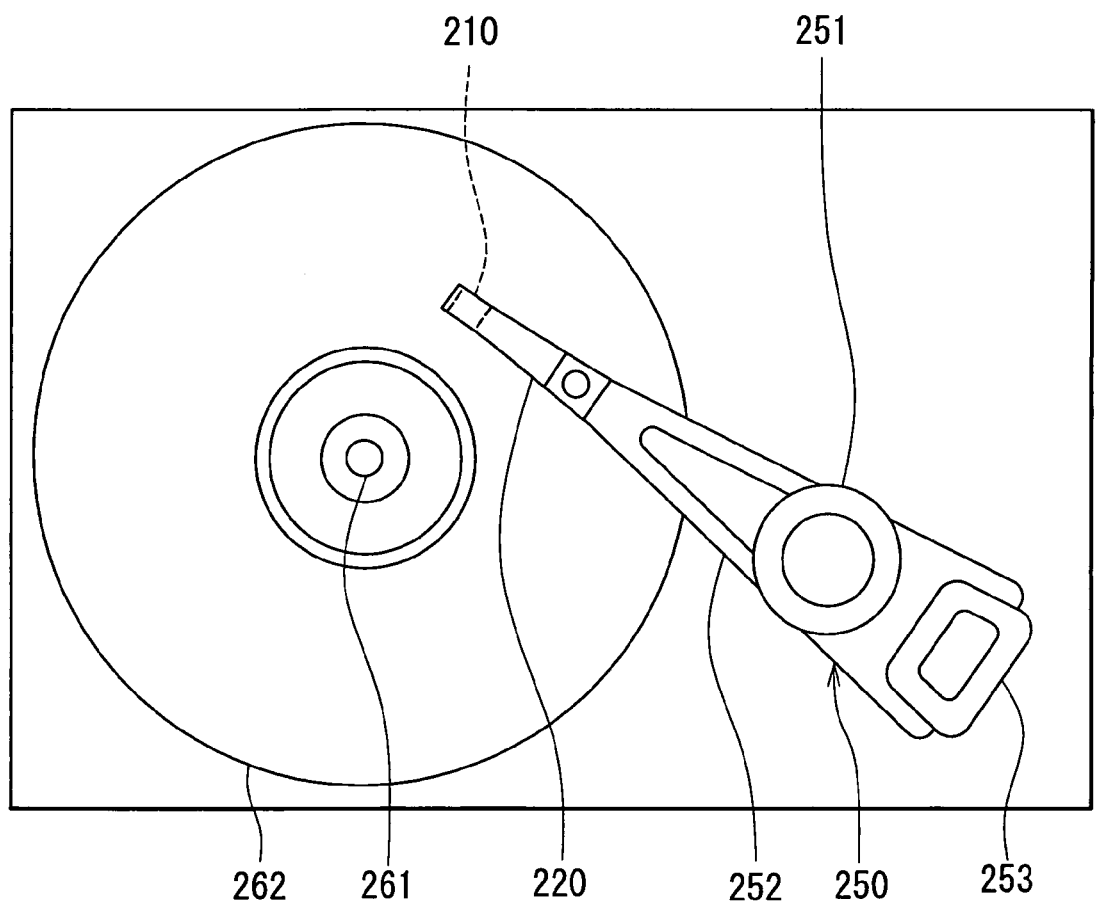
FIG. 9 is a top view of the magnetic disk drive of the first embodiment of the invention.

Reference is now made to FIG. 8 and FIG. 9 to describe an example of the head stack assembly and the magnetic disk drive of the embodiment. FIG. 8 illustrates the main part of the magnetic disk drive. FIG. 9 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention and support the sliders 210 and align them with respect to the magnetic disk platters 262.

In the magnetic disk drive of the embodiment the actuator moves the slider 210 across the tracks of the magnetic disk platter 262 and aligns the slider 210 with respect to the magnetic disk platter 262. The magnetic head incorporated in the slider 210 writes data on the magnetic disk platter 262 through the use of the write head and reads data stored on the magnetic disk platter 262 through the use of the read head.

The head gimbal assembly, the head arm assembly and the magnetic disk drive of the embodiment exhibit effects similar to those of the foregoing thin-film magnetic head of the embodiment.

MODIFICATION EXAMPLES

First to fifth modification examples of the embodiment will now be described. In the example shown in FIG. 1 and FIG. 2, the conductive film 40 is disposed in a range touching the entire first side surface 30a of the layered structure 30, and the shield layers 3 and 8, the insulating layer 7 and the bias field applying layers 6 around the entire first side surface 30a. In this case, a sense current passing through the conductive film 40 also includes components that would not contribute to the emergence of the magnetoresistive effect. It is assumed that the greater the proportion of these components with respect to the entire sense current, the lower is the magnetoresistive effect. The first to fifth modification examples are those in which improvements are made to reduce the proportion of these components with respect to the entire sense current.

Figure 10:
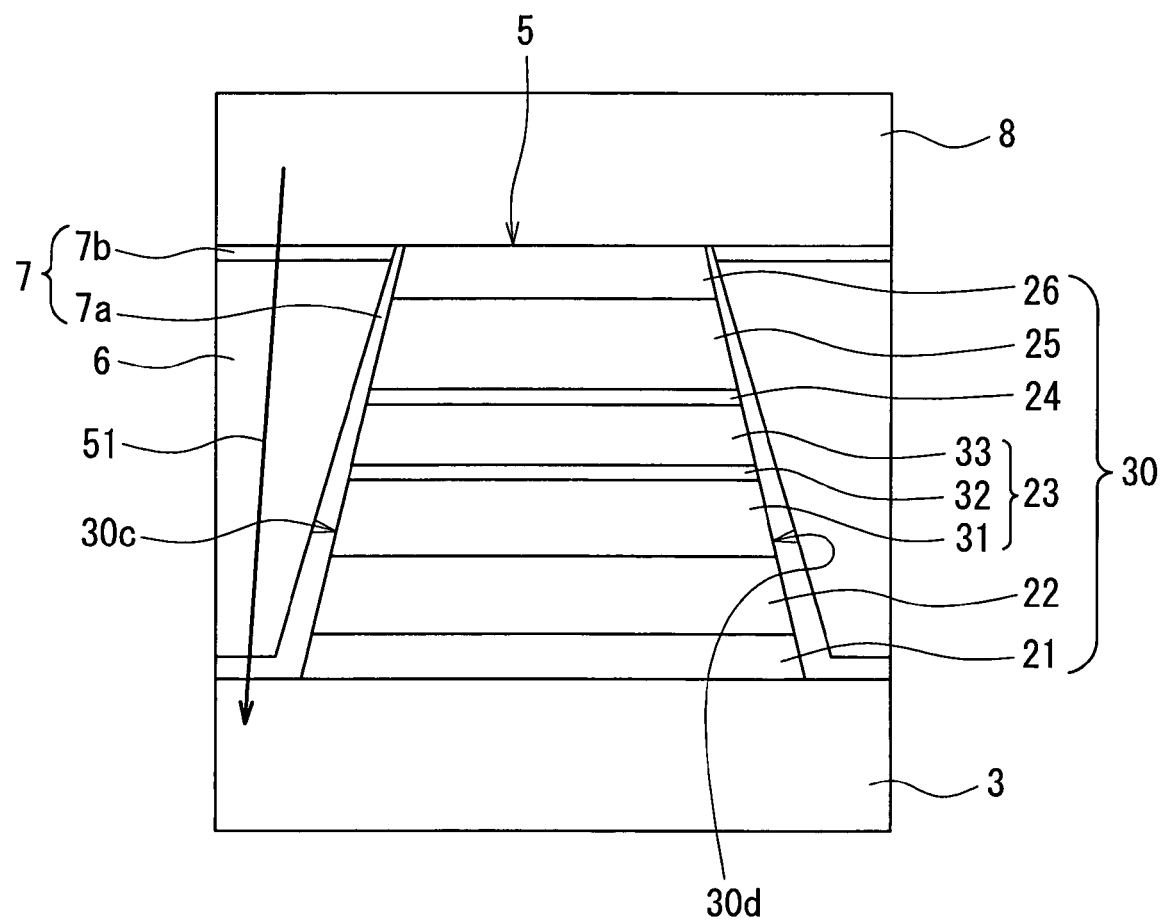
FIG. 10 is a plot for describing components that would not contribute to the emergence of a magnetoresistive effect among components of a sense current of the first embodiment of the invention.
Figure 11:
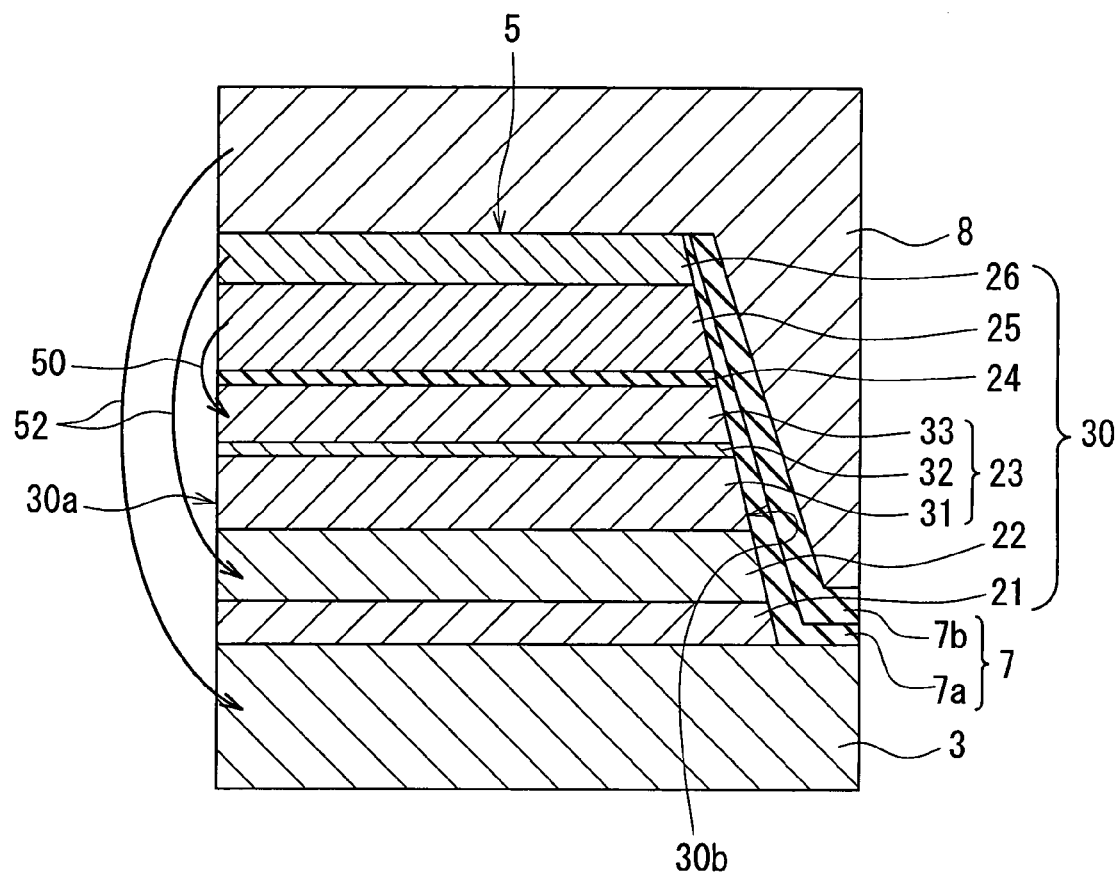
FIG. 11 is a plot for describing components that would not contribute to the emergence of the magnetoresistive effect among components of a sense current of the first embodiment of the invention.

Reference is now made to FIG. 10 and FIG. 11 to describe the components of the sense current that would not contribute to the emergence of the magnetoresistive effect. FIG. 10 illustrates the medium facing surface of the read head. FIG. 11 illustrates a cross section of the read head parallel to the medium facing surface. In FIG. 10 and FIG. 11 the conductive film 40 is not shown for convenience. In the case in which the conductive film 40 is formed as in the example shown in FIG. 1 and FIG. 2, the sense current passing through the conductive film 40 contains components that flow between the free layer 25 and the pinned layer 23 via the conductive film 40, as indicated with an arrow with numeral 50 in FIG. 11. These components are those that contribute to the emergence of a magnetoresistive effect. In addition to these components, the sense current passing through the conductive film 40 contains components that flow through a region located outside the layered structure 30 taken in the direction of track width, as indicated with an arrow with numeral 51 in FIG. 10. These components are those that would not contribute to the emergence of a magnetoresistive effect. These components will be hereinafter called first unwanted components. Furthermore, the sense current passing through the conductive film 40 contains components that flow through a portion of the conductive film 40 located between the first side surface 30a of the layered structure 30 and the medium facing surface 20 but do not pass through the free layer 25 and the pinned layer 23, as indicated with arrows with numeral 52 in FIG. 11. These components are those that would not contribute to the emergence of a magnetoresistive effect, too. These components will be hereinafter called second unwanted components.

First Modification Example

Figure 12:
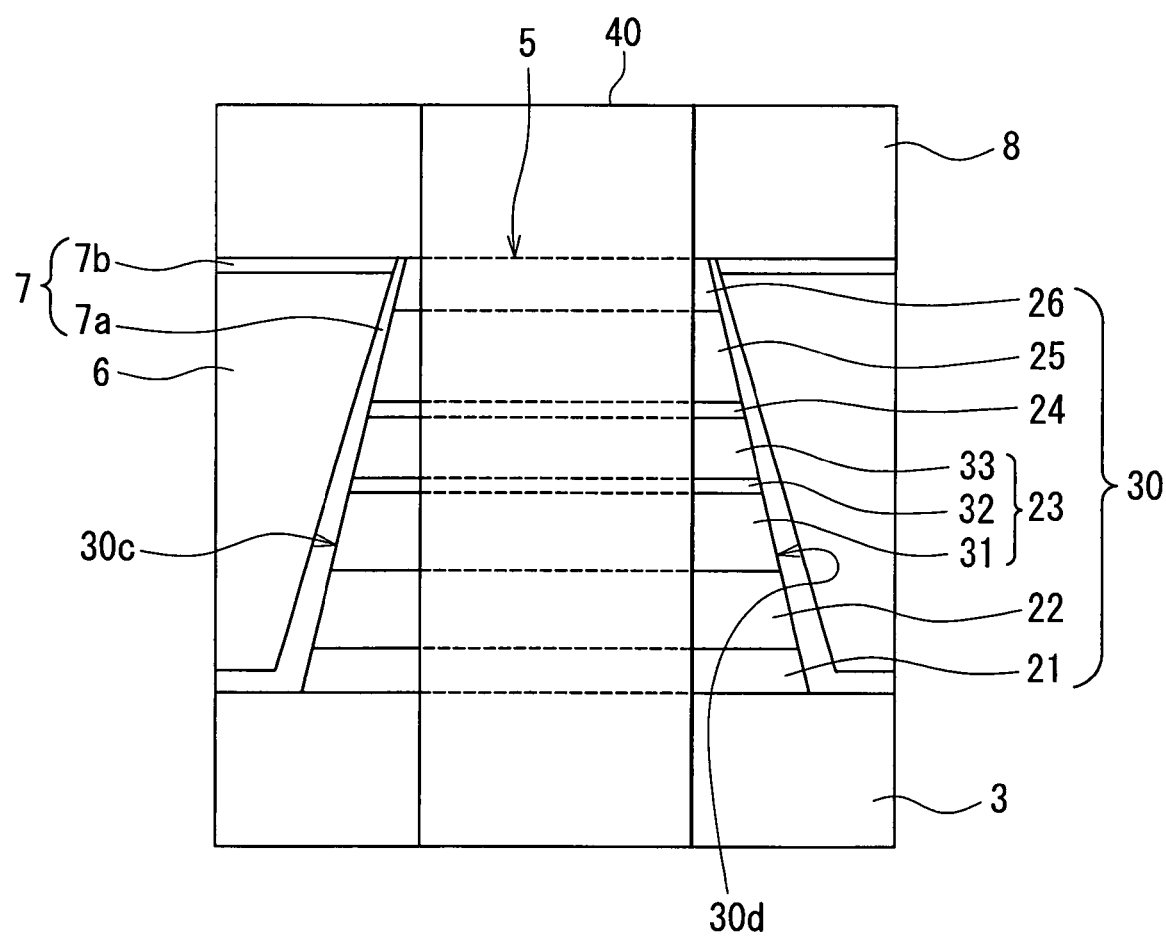
FIG. 12 is a front view illustrating a medium facing surface of a read head of a first modification example of the first embodiment of the invention.

FIG. 12 is a front view of the medium facing surface of a read head of a first modification example. In the first modification example the width (the length taken in the direction of track width) of the conductive film 40 is smaller than the example shown in FIG. 1 and FIG. 2, and the conductive film 40 touches the first side surface 30a of the layered structure 30 and the shield layers 3 and 8 but does not touch the insulating layer 7 and the bias field applying layers 6. The width of the conductive film 40 of the first modification example is slightly smaller than the minimum width of the first side surface 30a of the layered structure 30. According to the first modification example, the first unwanted components of the sense current do not exist, so that it is possible to make the MR ratio of the MR element 5 higher than that of the example shown in FIG. 1 and FIG. 2.

Second Modification Example

Figure 13:
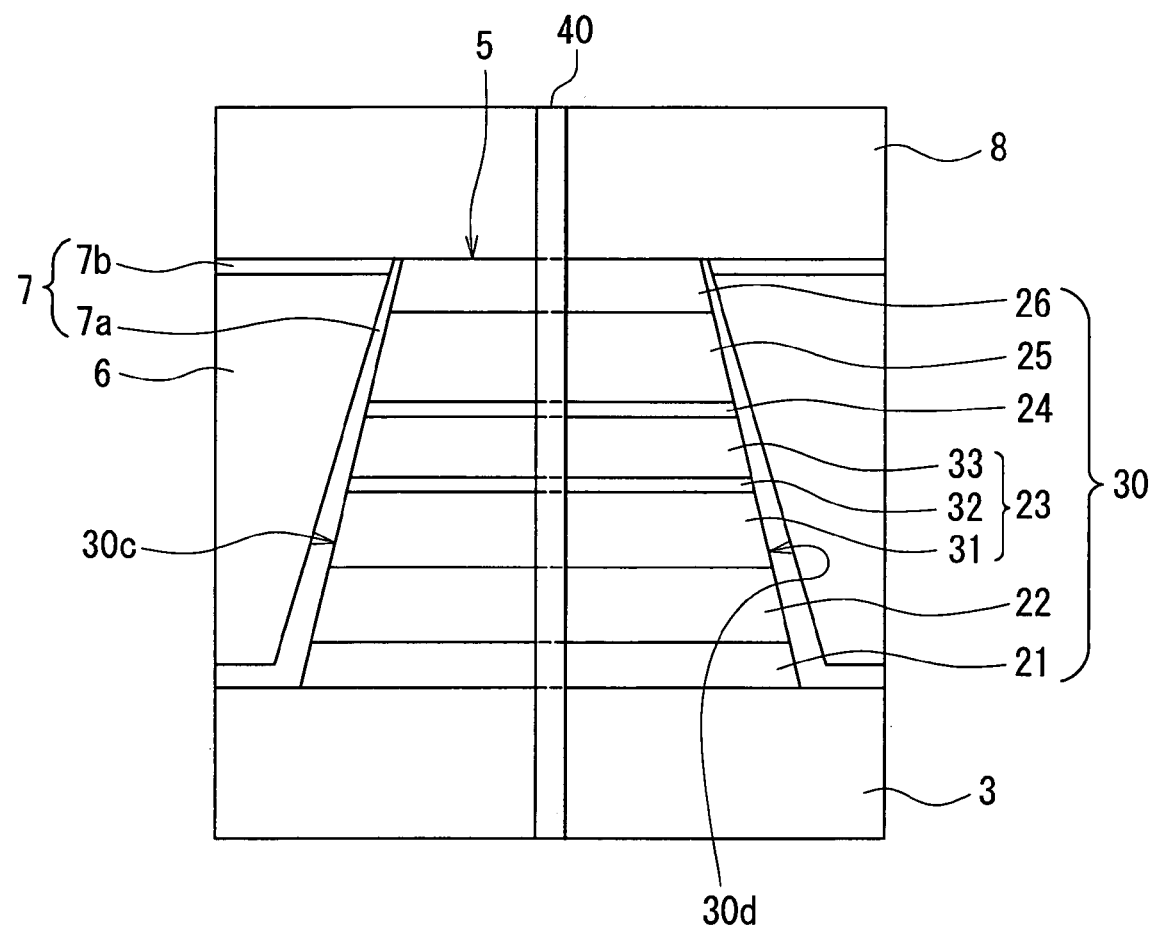
FIG. 13 is a front view illustrating a medium facing surface of a read head of a second modification example of the first embodiment of the invention.

FIG. 13 is a front view of the medium facing surface of a read head of a second modification example. In the second modification example the width (the length taken in the direction of track width) of the conductive film 40 is smaller than that of the first modification example. According to the second modification example, the rectilinearity of current passing through the conductive film 40 is better than that of the first modification example, so that it is possible to make the MR ratio of the MR element 5 higher than that of the first modification example.

Third Modification Example

Figure 14:
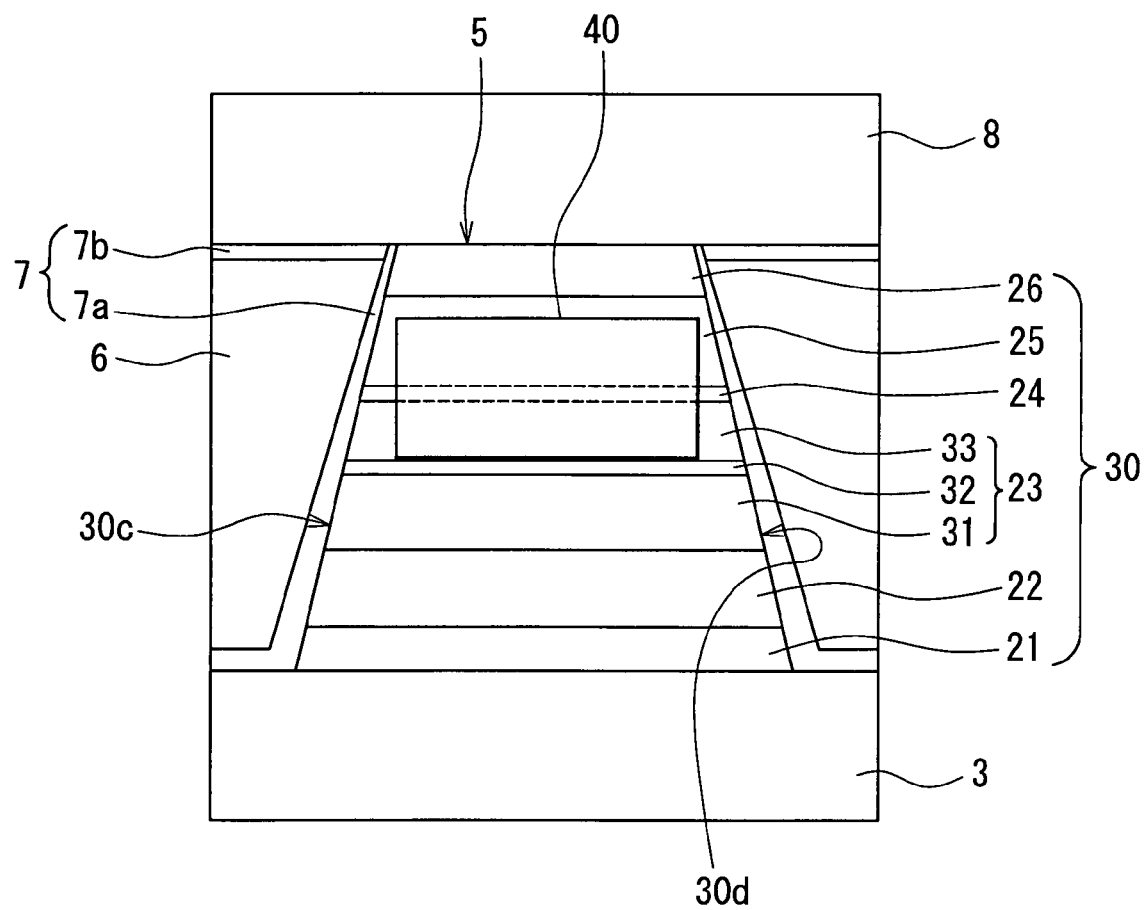
FIG. 14 is a front view illustrating a medium facing surface of a read head of a third modification example of the first embodiment of the invention.
Figure 15:
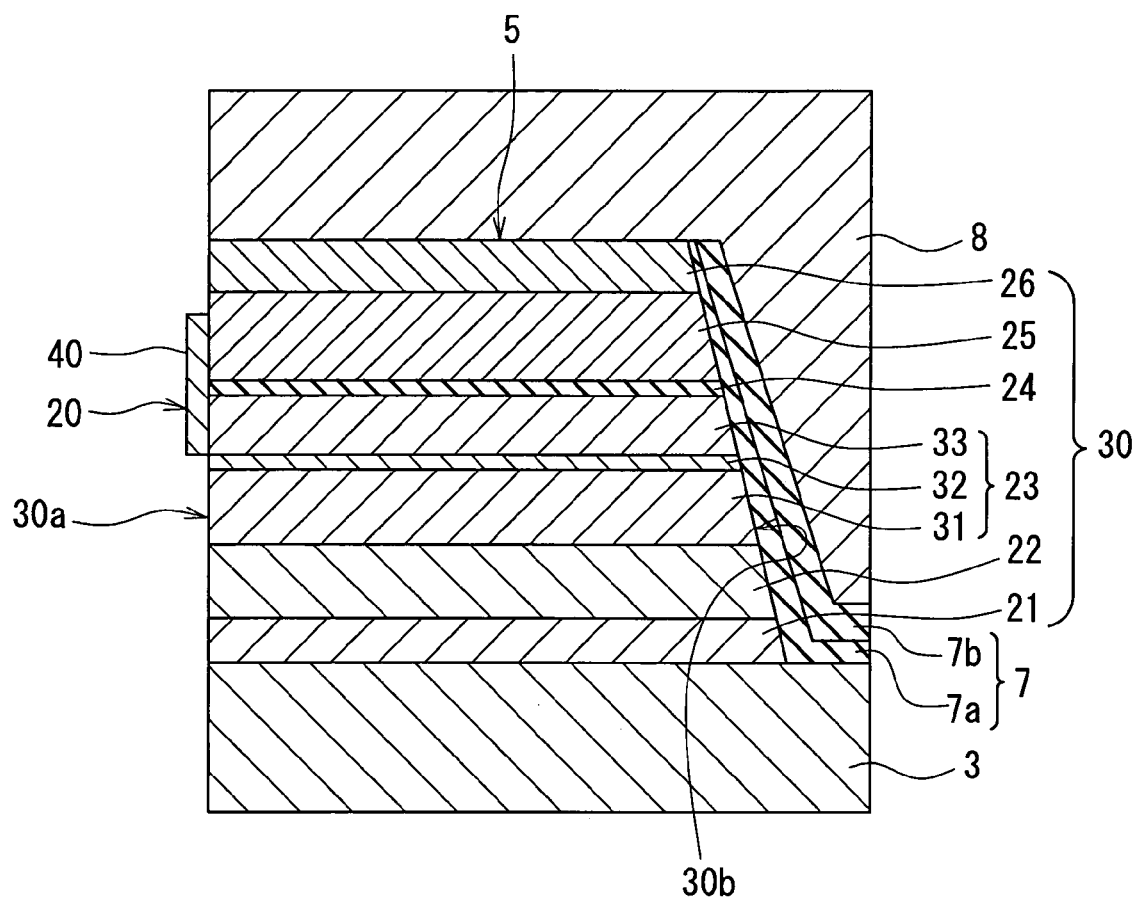
FIG. 15 is a cross-sectional view illustrating a cross section of the read head of the third modification example of the first embodiment of the invention, the cross section being orthogonal to the medium facing surface and the plane of the substrate.

FIG. 14 is a front view of the medium facing surface of a read head of a third modification example. FIG. 15 is a cross-sectional view of the read head of the third modification example orthogonal to the medium facing surface and the plane of the substrate. In the third modification example the conductive film 40 touches only the peripheral surface of each of the inner layer 33, the spacer layer 24 and the free layer 25 in the first side surface 30a of the layered structure 30. The width (the length taken in the direction of track width) of the conductive film 40 of the third modification example is similar to that of the first modification example. According to the third modification example, the first and second unwanted components of the sense current do not exist, so that it is possible to make the MR ratio of the MR element 5 higher than that of the first modification example.

Fourth Modification Example

Figure 16:
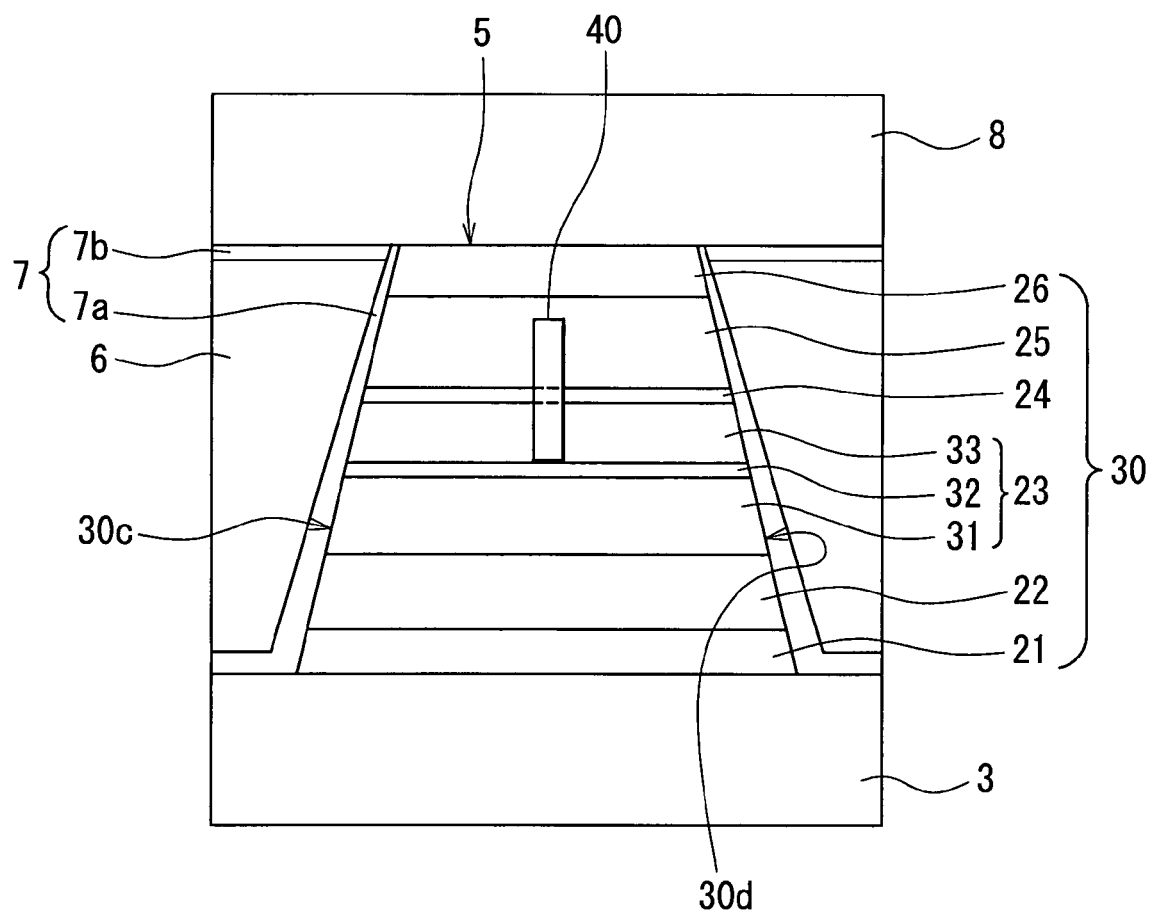
FIG. 16 is a front view illustrating a medium facing surface of a read head of a fourth modification example of the first embodiment of the invention.

FIG. 16 is a front view of the medium facing surface of a read head of a fourth modification example. In the fourth modification example the width (the length taken in the direction of track width) of the conductive film 40 is smaller than that of the third modification example. According to the fourth modification example, the rectilinearity of current passing through the conductive film 40 is better than that of the third modification example, so that it is possible to make the MR ratio of the MR element 5 higher than that of the third modification example.

Fifth Modification Example

Figure 17:
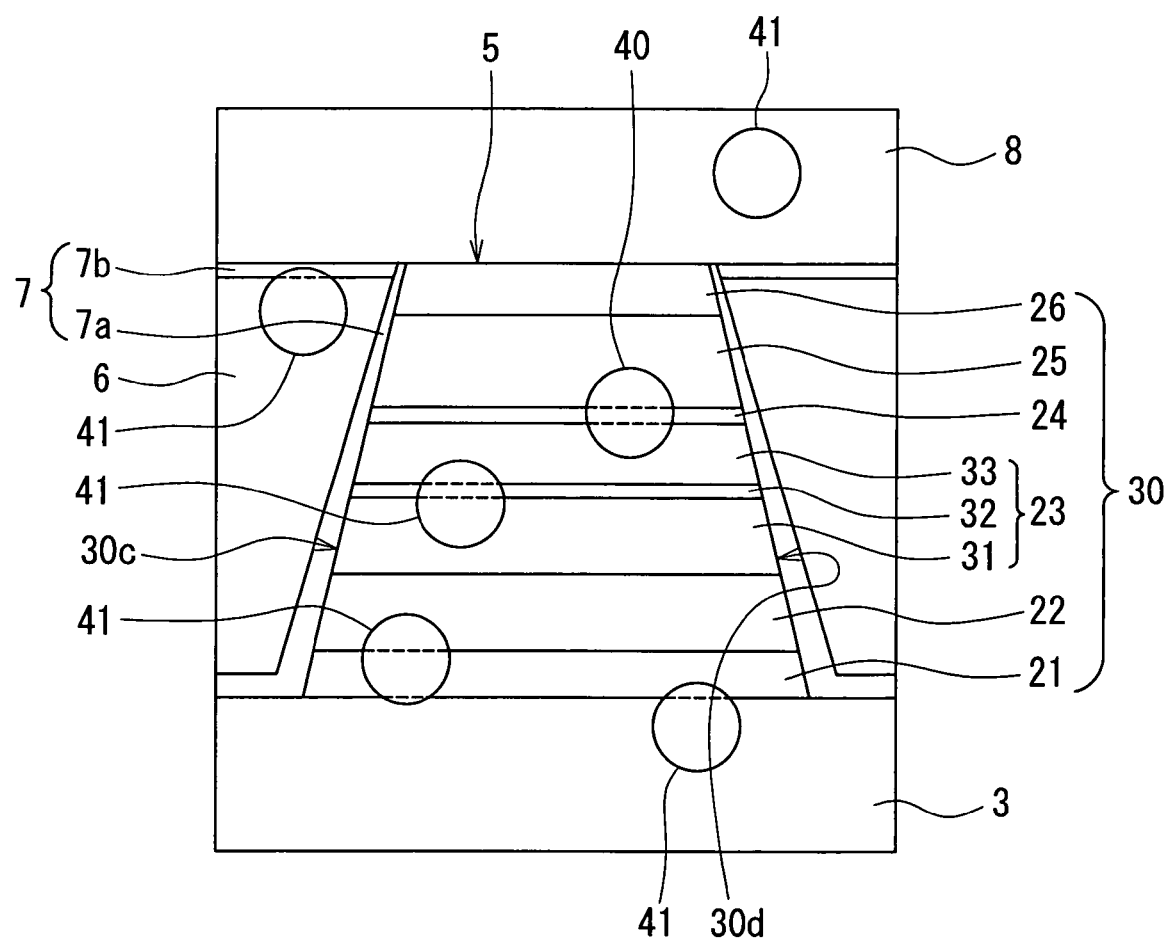
FIG. 17 is a front view illustrating a medium facing surface of a read head of a fifth modification example of the first embodiment of the invention.
Figure 18:
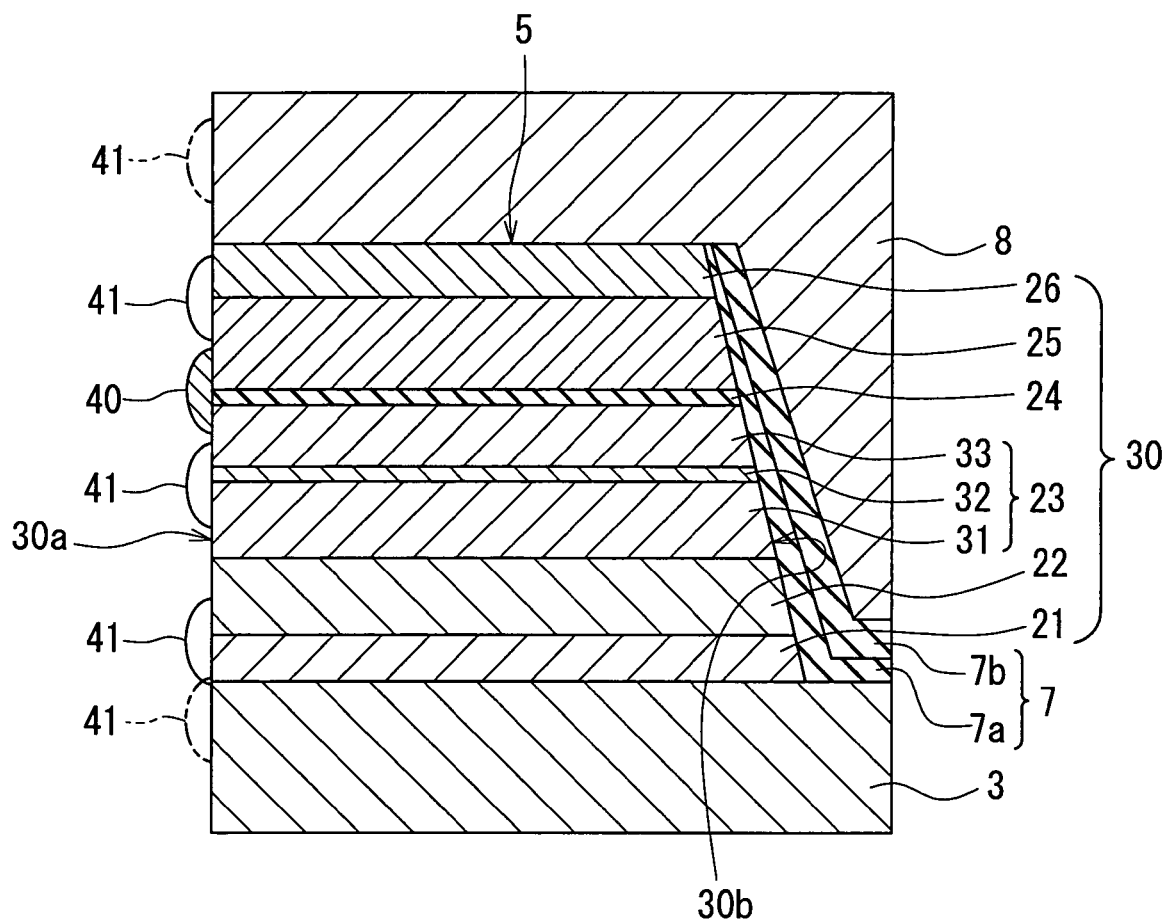
FIG. 18 is a cross-sectional view illustrating a cross section of the read head of the fifth modification example of the first embodiment of the invention, the cross section being orthogonal to the medium facing surface and the plane of the substrate.

FIG. 17 is a front view of the medium facing surface of a read head of a fifth modification example. FIG. 18 is a cross-sectional view of the read head of the fifth modification example orthogonal to the medium facing surface and the plane of the substrate. In the fifth modification example the conductive film 40 touches only the peripheral surface of each of the inner layer 33, the spacer layer 24 and the free layer 25 in the first side surface 30a of the layered structure 30. The conductive film 40 of the fifth modification example is a film grown into an island-like shape. The conductive film 40 of the fifth modification example is formed in a manner that will now be described. A plurality of films made of the material of the conductive film 40 and separated from one another are formed into island-like shapes by sputtering, for example, on the lapped surface formed in the pre-head portions. As a result, there is formed with a certain probability a film that touches only the peripheral surface of each of the inner layer 33, the spacer layer 24 and the free layer 25 in the first side surface 30a of the layered structure 30. This film becomes the conductive film 40. The plurality of films grown into island-like shapes include a plurality of films 41 that do not touch the peripheral surface of each of the inner layer 33, the spacer layer 24 and the free layer 25. These films 41 would not become the conductive film 40. The films 41 would not contribute to the emergence of a magnetoresistive effect. Since the respective films 41 are small, they hardly form a current path that would produce the first unwanted components and/or the second unwanted components of the sense current. Therefore, the films 41 hardly affect the characteristics of the MR element 5.

Whether a plurality of films made of the material of the conductive film 40 are formed into island-like shapes on the lapped surface formed in the pre-head portions depends on conditions such as the film thickness, the energy of molecules forming the films, and the surface energy of the lapped surface. Therefore, it is possible to form the conductive film 40 of the fifth modification example by choosing conditions under which a plurality of films are grown into island-like shapes. To be specific, it is possible to form the conductive film 40 of the fifth modification example by controlling conditions such as the target value of the thickness of the conductive film 40, the temperature at which the films are formed, and gases used for forming the films. According to the fifth modification example, it is easier to form the conductive film 40, compared with the case in which a patterned conductive film 40 is formed through the use of photolithography.

Second Embodiment

Figure 19:
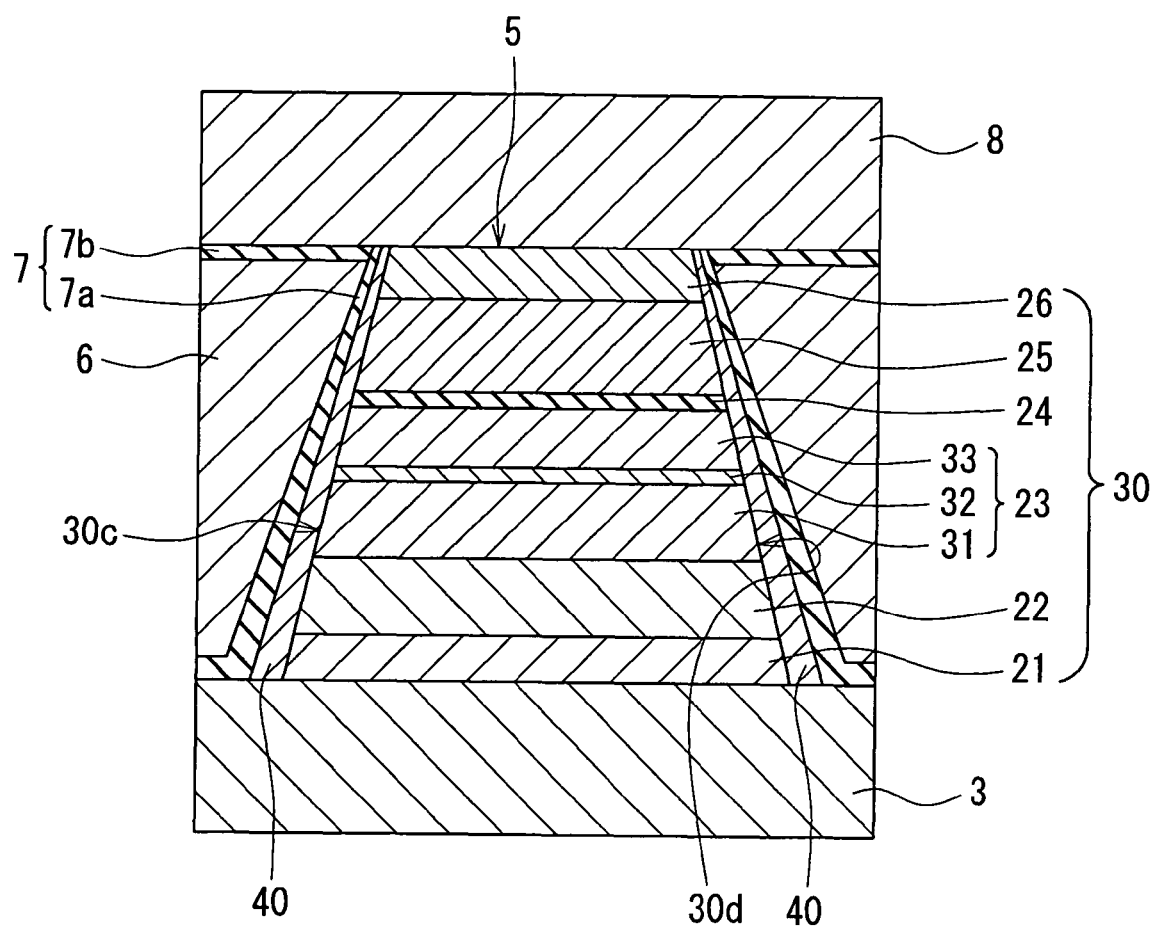
FIG. 19 is a cross-sectional view illustrating a cross section of a read head of a second embodiment of the invention, the cross section being parallel to a medium facing surface.

Reference is now made to FIG. 19 to describe a second embodiment of the invention. FIG. 19 is a cross-sectional view illustrating a cross section of a read head of the second embodiment, the cross section being parallel to the medium facing surface. In the second embodiment the conductive film 40 is disposed on the third side surface 30c and the fourth side surface 30d of the peripheral surface of the layered structure 30, not on the first side surface 30a. The conductive film 40 may be disposed to cover the entire side surfaces 30c and 30d or may be disposed to cover part of each of the side surfaces 30c and 30d as in the first to fifth modification examples of the first embodiment.

In the step of forming the conductive film 40 of a method of manufacturing the MR element 5 of the second embodiment, the conductive film 40 is formed on the side surfaces 30c and 30d by sputtering, for example, after the layered structure 30 is formed and before the insulating film 7a is formed. As a result, the conductive film 40 is disposed between the insulating film 7a and the side surfaces 30c and 30d.

In the second embodiment the conductive film 40 may be disposed only on one of the third side surface 30c and the fourth side surface 30d. In the second embodiment the conductive film 40 may be disposed on the first side surface 30a, too. The remainder of configuration, function and effects of the second embodiment are similar to those of the first embodiment.

Third Embodiment

Figure 20:
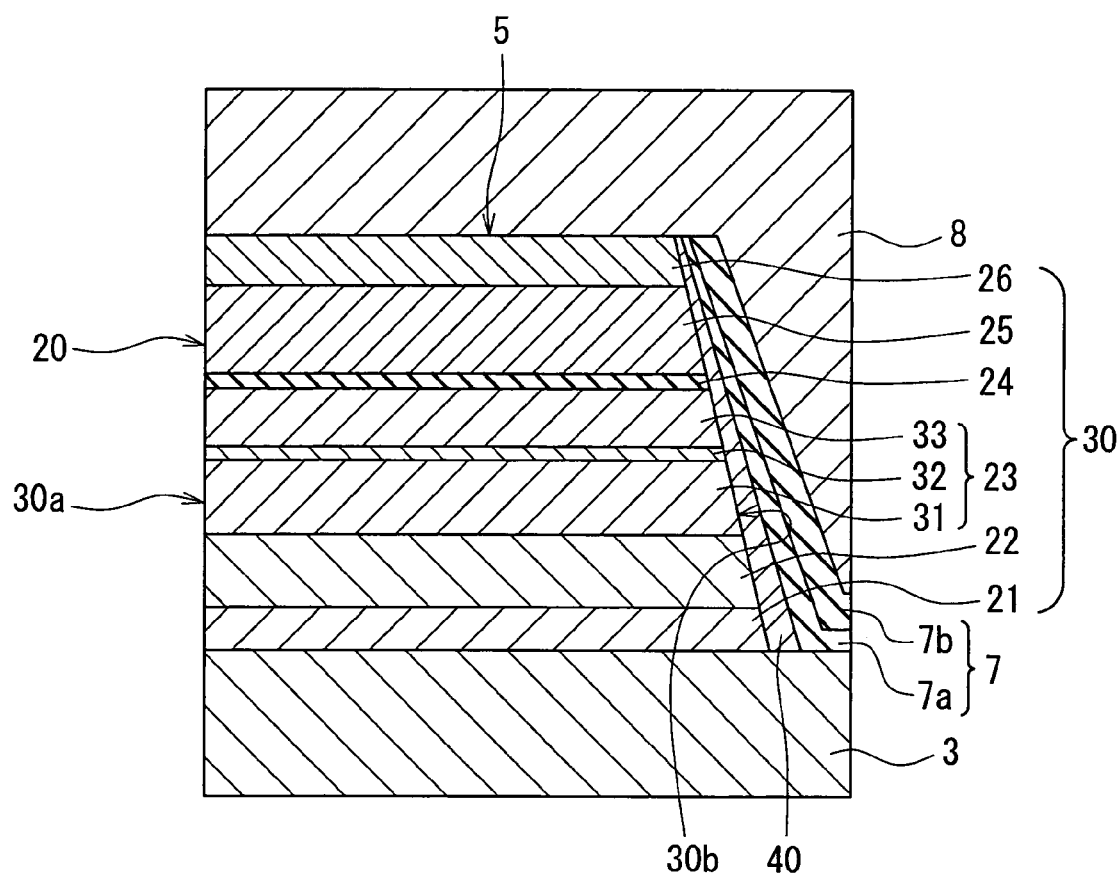
FIG. 20 is a cross-sectional view illustrating a cross section of a read head of a third embodiment of the invention, the cross section being orthogonal to a medium facing surface and a substrate.

Reference is now made to FIG. 20 to describe a third embodiment of the invention. FIG. 20 is a cross-sectional view illustrating a cross section of a read head of the third embodiment, the cross section being orthogonal to the medium facing surface and the plane of the substrate. In the third embodiment the conductive film 40 is disposed on the second side surface 30b of the peripheral surface of the layered structure 30, not on the first side surface 30a. The conductive film 40 may be disposed to cover the entire side surfaces 30b or may be disposed to cover only part of the side surfaces 30b as in the first to fifth modification examples of the first embodiment.

In the step of forming the conductive film 40 of a method of manufacturing the MR element 5 of the third embodiment, the conductive film 40 is formed on the side surface 30b by sputtering, for example, after the layered structure 30 is formed and before the insulating film 7a is formed. As a result, the conductive film 40 is disposed between the insulating film 7a and the side surface 30b.

In the third embodiment the conductive film 40 may be also disposed on at least one of the first side surface 30a, the third side surface 30c and the fourth side surface 30d in addition to the second side surface 30b. The remainder of configuration, function and effects of the third embodiment are similar to those of the first embodiment.

Fourth Embodiment

Figure 21:
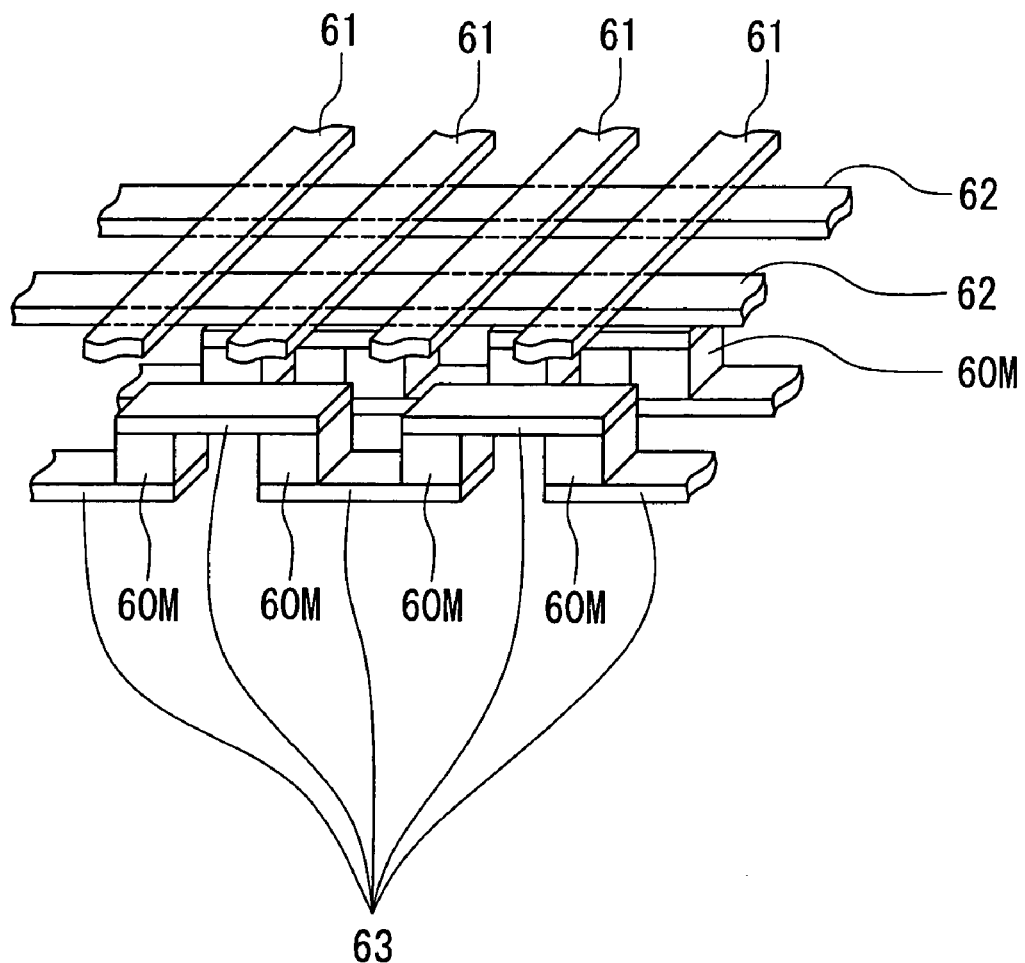
FIG. 21 is a perspective view illustrating a main part of a magnetic memory of a fourth embodiment of the invention.
Figure 22:
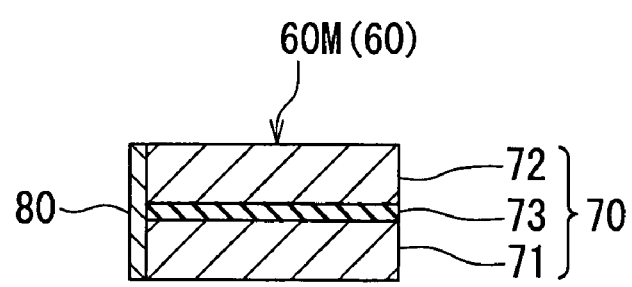
FIG. 22 is a cross-sectional view of an MR element of the fourth embodiment of the invention.

Reference is now made to FIG. 21 and FIG. 22 to describe a fourth embodiment of the invention. FIG. 21 is a perspective view illustrating a main part of a magnetic memory of the fourth embodiment. FIG. 22 is a cross-sectional view of an MR element of the fourth embodiment.

As shown in FIG. 21, the magnetic memory of the fourth embodiment incorporates: a plurality of memory elements 60M aligned in a matrix; a plurality of word lines 61 disposed parallel to one another; a plurality of bit lines 62 disposed parallel to one another; and a plurality of sense lines 63 disposed parallel to one another. The word lines 61, the bit lines 62 and the sense lines 63 are disposed with a space between respective adjacent ones along the vertical direction, and insulated from one another.

The word lines 61 and the bit lines 62 extend in the directions intersecting each other at a right angle. In FIG. 21 when seen from above, the word lines 61 and the bit lines 62 intersect each other at points at which the respective memory elements 60M are located. The word lines 61 and the bit lines 62 are provided for writing data on the respective memory elements 60M, and correspond to the write lines of the invention.

The sense lines 63 are disposed parallel to the bit lines 62. Each of the sense lines 63 connects a row of memory elements 60M in series, the memory elements 60M being aligned in the direction in which each of the bit lines 62 extends. The sense lines 63 are provided for feeding the memory elements 60M currents for reading data from the memory elements 60M, and correspond to the read lines of the invention.

FIG. 22 is a cross-sectional view of the memory element 60M. The memory element 60M is formed of an MR element 60 of the fourth embodiment. The MR element 60 incorporates a layered structure 70 including: a spacer layer 73 having a first surface (bottom surface) and a second surface (top surface) that face toward opposite directions; a first ferromagnetic layer 71 disposed adjacent to the first surface of the spacer layer 73; and a second ferromagnetic layer 72 disposed adjacent to the second surface of the spacer layer 73. The coercivity of the second ferromagnetic layer 72 is higher than that of the first ferromagnetic layer 71. The first ferromagnetic layer 71 may be made of any of Fe, NiFe and NiFeCo, for example. The second ferromagnetic layer 72 may be made of any of Co, CoFe, CoPt and MnSb, for example. The spacer layer 73 is a layer at least part of which is made of a material other than a conductor, and intercepts the passage of currents or limits the passage of currents as compared with a layer entirely made of a conductor.

The layered structure 70 has a peripheral surface formed of peripheral surfaces of the layers 71, 72 and 73. The MR element 60 further incorporates a conductive film 80 that is disposed on the peripheral surface of the layered structure 70 and that allows conduction between the first ferromagnetic layer 71 and the second ferromagnetic layer 72. It suffices that the conductive film 80 allows conduction between the first ferromagnetic layer 71 and the second ferromagnetic layer 72, and the conductive film 80 may be disposed on the entire peripheral surface of the layered structure 70 or may be disposed on only part of the peripheral surface of the layered structure 70. The current supplied from the sense line 63 is fed between the first ferromagnetic layer 71 and the second ferromagnetic layer 72 so that part of the current passes through the conductive film 80.

The spacer layer 73 has features the same as those of the spacer layer 24 of the first embodiment. The conductive film 80 has features the same as those of the conductive film 40 of the first embodiment. In the MR element 60 of the fourth embodiment, a magnetoresistive effect is produced in accordance with a principle the same as that of the MR element 5 of the first embodiment. Therefore, in the MR element 60, the resistance thereof changes with the relative angle between the direction of magnetization of the first ferromagnetic layer 71 and that of the second ferromagnetic layer 72.

A method of manufacturing the MR element 60 of the fourth embodiment includes the step of forming the layered structure 70 and the step of forming the conductive film 80 on the peripheral surface of the layered structure 70. In the step of forming the layered structure 70, films that will be the layers constituting the layered structure 70 are formed one by one by sputtering, for example. Next, these films are patterned by etching to form the layered structure 70. In the step of forming the conductive film 80, the conductive film 80 is formed on the peripheral surface of the layered structure 70 by sputtering, for example.

An example of operation of the magnetic memory of the fourth embodiment will now be described. First, to write data in any one of the memory elements 60M, a current for writing is fed to each of the word line 61 and the bit line 62 that intersect each other at a point at which the target memory element 60M is located when seen from above in FIG. 21. The direction of current flowing through the word line 61 varies depending on whether the data to be written on the memory element 60M is '0' or '1'. The direction of magnetization of the ferromagnetic layers 71 and 72 in the target memory element 60M can be changed by a composite magnetic field resulting from a combination of a magnetic field generated by a current flowing through the word line 61 and a magnetic field generated by a current flowing through the bit line 62. The direction of magnetization of the ferromagnetic layers 71 and 72 in the target memory element 60M is determined by the direction of current flowing through the word line 61.

To read data from any one of the memory elements 60M, a current for reading is fed to the sense line 63 connected to the target memory element 60M, and a read pulse current whose direction is switchable is fed to the word line 61 that passes through the point at which the target memory element 60M is located when seen from above in FIG. 21. When the read pulse current is fed to the word line 61, the direction of magnetization of the first ferromagnetic layer 71 of the memory element 60M is switched, but the direction of magnetization of the second ferromagnetic layer 72 is not changed. As a result, the mode of a change in resistance of the memory element 60M when the read pulse current is fed to the word line 61 varies depending on the direction of magnetization of the second ferromagnetic layer 72, that is, the data written on the memory element 60M. It is therefore possible to discriminate data written on the memory element 60M by detecting a variation in voltage of the sense line 63 when the read pulse current is fed to the word line 61.

While the foregoing description has illustrated the case where data is written on the memory element 60M by changing the directions of magnetization of both the ferromagnetic layers 71 and 72, it is also possible to write data on the memory element 60M by changing the direction of magnetization of only the first ferromagnetic layer 71 while the direction of magnetization of the second ferromagnetic layer 72 is not changed.

The MR element 60 of the fourth embodiment exhibits effects the same as those of the MR element 5 of the first embodiment. That is, in the MR element 60 of the fourth embodiment, a conducting portion for allowing conduction between the first ferromagnetic layer 71 and the second ferromagnetic layer 72 is formed by the conductive film 80 disposed on the peripheral surface of the layered structure 70. It is possible that, in this conducting portion, the width of the narrowest portion in the cross section intersecting the direction of passage of a current at a right angle coincides with the thickness of the conductive film 80. It is easier to control the small thickness of the conductive film 80 than to control the small width of the film by photolithography. As a result, according to the MR element 60 of the fourth embodiment or the method of manufacturing the same, or the magnetic memory that incorporates the MR element 60 of the embodiment, it is easy to control the small width of the conducting portion for allowing conduction between the first ferromagnetic layer 71 and the second ferromagnetic layer 72. Furthermore, it is thereby possible to manufacture the MR element 60 having a desired magnetoresistive effect, or the magnetic memory that incorporates the MR element 60 with reliability.

The present invention is not limited to the foregoing embodiments but may be practiced in still other ways. For example, in the first to third embodiments, the pinned layer 23 is not limited to a synthetic pinned layer. Furthermore, while the thin-film magnetic head disclosed in the first embodiment has such a configuration that the read head is formed on the base body and the write head is stacked on the read head, it is also possible that the read head is stacked on the write head. If the thin-film magnetic head is to be used only for read operations, the thin-film magnetic head may be configured to incorporate a read head only.

The MR element 60 of the fourth embodiment is not only applicable to the magnetic memory having a configuration illustrated in FIG. 21 but to magnetic memories in general each incorporating an MR element.

Obviously many modifications and variations of the present invention are possible in the light of the above teachings. It is therefore to be understood that within the scope of the appended claims the invention may be practiced otherwise than as specifically described.

What is claimed is:

1. A magnetoresistive element comprising a layered structure, the layered structure including: a spacer layer having a first surface and a second surface that face toward opposite directions; a free layer disposed adjacent to the first surface of the spacer layer and having a direction of magnetization that changes in response to an external magnetic field; and a pinned layer disposed adjacent to the second surface of the spacer layer and having a fixed direction of magnetization, wherein:

the spacer layer is a layer at least part of which is made of a material other than a conductor, and the spacer layer intercepts the passage of currents or limits the passage of currents as compared with a layer entirely made of a conductor; and the layered structure has a peripheral surface formed of peripheral surfaces of the foregoing layers, the magnetoresistive element further comprising a conductive film that is disposed on the peripheral surface of the layered structure and allows conduction between the free layer and the pinned layer, wherein a current is fed between the free layer and the pinned layer such that at least part of the current passes through the conductive film.

2. The magnetoresistive element according to claim 1, wherein the conductive film is made of a magnetic material.

3. The magnetoresistive element according to claim 2, wherein the conductive film has a thickness smaller than or equal to 2 nm.

4. The magnetoresistive element according to claim 1, wherein the conductive film is made of a nonmagnetic material.

5. The magnetoresistive element according to claim 4, wherein the conductive film has a thickness smaller than or equal to 20 nm.

6. A method of manufacturing a magnetoresistive element, the magnetoresistive element comprising a layered structure including: a spacer layer having a first surface and a second surface that face toward opposite directions; a free layer disposed adjacent to the first surface of the spacer layer and having a direction of magnetization that changes in response to an external magnetic field; and a pinned layer disposed adjacent to the second surface of the spacer layer and having a fixed direction of magnetization, wherein:

the spacer layer is a layer at least part of which is made of a material other than a conductor, and the spacer layer intercepts the passage of currents or limits the passage of currents as compared with a layer entirely made of a conductor; and the layered structure has a peripheral surface formed of peripheral surfaces of the foregoing layers, the magnetoresistive element further comprising a conductive film that is disposed on the peripheral surface of the layered structure and allows conduction between the free layer and the pinned layer, wherein a current is fed between the free layer and the pinned layer such that at least part of the current passes through the conductive film, the method comprising the steps of:

forming the layered structure; and forming the conductive film on the peripheral surface of the layered structure.

7. A thin-film magnetic head comprising: a medium facing surface that faces toward a recording medium; a magnetoresistive element disposed near the medium facing surface for detecting a signal magnetic field sent from the recording medium as an external magnetic field; and a pair of electrodes for feeding a current for detecting the external magnetic field, the current being fed between the free layer and the pinned layer, wherein:

the magnetoresistive element comprises a layered structure including: a spacer layer having a first surface and a second surface that face toward opposite directions; a free layer disposed adjacent to the first surface of the spacer layer and having a direction of magnetization that changes in response to the external magnetic field; and a pinned layer disposed adjacent to the second surface of the spacer layer and having a fixed direction of magnetization;

the spacer layer is a layer at least part of which is made of a material other than a conductor, and the spacer layer intercepts the passage of currents or limits the passage of currents as compared with a layer entirely made of a conductor;

the layered structure has a peripheral surface formed of peripheral surfaces of the foregoing layers;

the magnetoresistive element further comprises a conductive film that is disposed on the peripheral surface of the layered structure and allows conduction between the free layer and the pinned layer; and, in the magnetoresistive element, the current is fed between the free layer and the pinned layer such that at least part of the current passes through the conductive film.

8. The thin-film magnetic head according to claim 7, wherein the peripheral surface of the layered structure has a portion facing toward the medium facing surface, and the conductive film is disposed between the portion of the peripheral surface and the medium facing surface.

9. A head gimbal assembly comprising: a slider including a thin-film magnetic head and disposed to face toward a recording medium; and a suspension flexibly supporting the slider, wherein:

the thin-film magnetic head comprises: a medium facing surface that faces toward the recording medium; a magnetoresistive element disposed near the medium facing surface for detecting a signal magnetic field sent from the recording medium as an external magnetic field; and a pair of electrodes for feeding a current for detecting the external magnetic field, the current being fed between the free layer and the pinned layer;

the magnetoresistive element comprises a layered structure including: a spacer layer having a first surface and a second surface that face toward opposite directions; a free layer disposed adjacent to the first surface of the spacer layer and having a direction of magnetization that changes in response to the external magnetic field; and a pinned layer disposed adjacent to the second surface of the spacer layer and having a fixed direction of magnetization;

the spacer layer is a layer at least part of which is made of a material other than a conductor, and the spacer layer intercepts the passage of currents or limits the passage of currents as compared with a layer entirely made of a conductor;

the layered structure has a peripheral surface formed of peripheral surfaces of the foregoing layers;

the magnetoresistive element further comprises a conductive film that is disposed on the peripheral surface of the layered structure and allows conduction between the free layer and the pinned layer; and, in the magnetoresistive element, the current is fed between the free layer and the pinned layer such that at least part of the current passes through the conductive film.

10. A head arm assembly comprising: a slider including a thin-film magnetic head and disposed to face toward a recording medium; a suspension flexibly supporting the slider; and an arm for making the slider travel across tracks of the recording medium, the suspension being attached to the arm, wherein:

the thin-film magnetic head comprises: a medium facing surface that faces toward the recording medium; a magnetoresistive element disposed near the medium facing surface for detecting a signal magnetic field sent from the recording medium as an external magnetic field; and a pair of electrodes for feeding a current for detecting the external magnetic field, the current being fed between the free layer and the pinned layer;

the magnetoresistive element comprises a layered structure including: a spacer layer having a first surface and a second surface that face toward opposite directions; a free layer disposed adjacent to the first surface of the spacer layer and having a direction of magnetization that changes in response to the external magnetic field; and a pinned layer disposed adjacent to the second surface of the spacer layer and having a fixed direction of magnetization;

the spacer layer is a layer at least part of which is made of a material other than a conductor, and the spacer layer intercepts the passage of currents or limits the passage of currents as compared with a layer entirely made of a conductor;

the layered structure has a peripheral surface formed of peripheral surfaces of the foregoing layers;

the magnetoresistive element further comprises a conductive film that is disposed on the peripheral surface of the layered structure and allows conduction between the free layer and the pinned layer; and, in the magnetoresistive element, the current is fed between the free layer and the pinned layer such that at least part of the current passes through the conductive film.

11. A magnetic disk drive comprising: a slider including a thin-film magnetic head and disposed to face toward a recording medium that is driven to rotate; and an alignment device supporting the slider and aligning the slider with respect to the recording medium, wherein:

the thin-film magnetic head comprises: a medium facing surface that faces toward the recording medium; a magnetoresistive element disposed near the medium facing surface for detecting a signal magnetic field sent from the recording medium as an external magnetic field; and a pair of electrodes for feeding a current for detecting the external magnetic field, the current being fed between the free layer and the pinned layer;

the magnetoresistive element comprises a layered structure including: a spacer layer having a first surface and a second surface that face toward opposite directions; a free layer disposed adjacent to the first surface of the spacer layer and having a direction of magnetization that changes in response to the external magnetic field; and a pinned layer disposed adjacent to the second surface of the spacer layer and having a fixed direction of magnetization;

the spacer layer is a layer at least part of which is made of a material other than a conductor, and the spacer layer intercepts the passage of currents or limits the passage of currents as compared with a layer entirely made of a conductor;

the layered structure has a peripheral surface formed of peripheral surfaces of the foregoing layers;

the magnetoresistive element further comprises a conductive film that is disposed on the peripheral surface of the layered structure and allows conduction between the free layer and the pinned layer; and, in the magnetoresistive element, the current is fed between the free layer and the pinned layer such that at least part of the current passes through the conductive film.

12. A magnetic sensor comprising a magnetoresistive element and a pair of electrodes, wherein:

the magnetoresistive element comprises a layered structure including: a spacer layer having a first surface and a second surface that face toward opposite directions; a free layer disposed adjacent to the first surface of the spacer layer and having a direction of magnetization that changes in response to an external magnetic field; and a pinned layer disposed adjacent to the second surface of the spacer layer and having a fixed direction of magnetization;

the spacer layer is a layer at least part of which is made of a material other than a conductor, and the spacer layer intercepts the passage of currents or limits the passage of currents as compared with a layer entirely made of a conductor;

the layered structure has a peripheral surface formed of peripheral surfaces of the foregoing layers;

the magnetoresistive element further comprises a conductive film that is disposed on the peripheral surface of the layered structure and allows conduction between the free layer and the pinned layer;

in the magnetoresistive element, a current is fed between the free layer and the pinned layer such that at least part of the current passes through the conductive film; and the pair of electrodes are those for feeding a current for detecting the external magnetic field between the free layer and the pinned layer.

13. A magnetoresistive element comprising a layered structure, the layered structure including: a spacer layer having a first surface and a second surface that face toward opposite directions; a first ferromagnetic layer disposed adjacent to the first surface of the spacer layer; and a second ferromagnetic layer disposed adjacent to the second surface of the spacer layer, wherein:

the second ferromagnetic layer has a coercivity higher than that of the first ferromagnetic layer;

the spacer layer is a layer at least part of which is made of a material other than a conductor, and the spacer layer intercepts the passage of currents or limits the passage of currents as compared with a layer entirely made of a conductor; and the layered structure has a peripheral surface formed of peripheral surfaces of the foregoing layers, the magnetoresistive element further comprising a conductive film that is disposed on the peripheral surface of the layered structure and allows conduction between the first and second ferromagnetic layers, wherein a current is fed between the first and second ferromagnetic layers such that at least part of the current passes through the conductive film.

14. The magnetoresistive element according to claim 13, wherein the conductive film is made of a magnetic material.

15. The magnetoresistive element according to claim 14, wherein the conductive film has a thickness smaller than or equal to 2 nm.

16. The magnetoresistive element according to claim 13, wherein the conductive film is made of a nonmagnetic material.

17. The magnetoresistive element according to claim 16, wherein the conductive film has a thickness smaller than or equal to 20 nm.

18. A method of manufacturing a magnetoresistive element, the magnetoresistive element comprising a layered structure including: a spacer layer having a first surface and a second surface that face toward opposite directions; a first ferromagnetic layer disposed adjacent to the first surface of the spacer layer; and a second ferromagnetic layer disposed adjacent to the second surface of the spacer layer, wherein:
  the second ferromagnetic layer has a coercivity higher than that of the first ferromagnetic layer;
  the spacer layer is a layer at least part of which is made of a material other than a conductor, and the spacer layer intercepts the passage of currents or limits the passage of currents as compared with a layer entirely made of a conductor; and
  the layered structure has a peripheral surface formed of peripheral surfaces of the foregoing layers,
  the magnetoresistive element further comprising a conductive film that is disposed on the peripheral surface of the layered structure and allows conduction between the first and second ferromagnetic layers, wherein
  a current is fed between the first and second ferromagnetic layers such that at least part of the current passes through the conductive film, the method comprising the steps of
  forming the layered structure; and
  forming the conductive film on the peripheral surface of the layered structure.

19. A magnetic memory comprising a plurality of memory elements arranged in a matrix, wherein:
  each of the memory elements is formed of a magnetoresistive element;
  the magnetoresistive element comprises a layered structure including: a spacer layer having a first surface and a second surface that face toward opposite directions; a first ferromagnetic layer disposed adjacent to the first surface of the spacer layer; and a second ferromagnetic layer disposed adjacent to the second surface of the spacer layer;
  the second ferromagnetic layer has a coercivity higher than that of the first ferromagnetic layer;
  the spacer layer is a layer at least part of which is made of a material other than a conductor, and the spacer layer intercepts the passage of currents or limits the passage of currents as compared with a layer entirely made of a conductor;
  the layered structure has a peripheral surface formed of peripheral surfaces of the foregoing layers;
  the magnetoresistive element further comprises a conductive film that is disposed on the peripheral surface of the layered structure and allows conduction between the first and second ferromagnetic layers; and,
  in the magnetoresistive element, a current is fed between the first and second ferromagnetic layers such that at least part of the current passes through the conductive film, the magnetic memory further comprising:
  a plurality of write lines for writing data on the memory elements; and
  a plurality of read lines for feeding currents for reading data from the memory elements, each of the currents being fed between the first and second ferromagnetic layers of the magnetoresistive element as each of the memory elements.

* * * * *